(12) United States Patent
Jung

(10) Patent No.: US 12,710,693 B2
(45) Date of Patent: Aug. 18, 2026

(54) PHOTOMASK INCLUDING LINE PATTERN MONITORING MARK AND METHOD OF MANUFACTURING INTEGRATED CIRCUIT DEVICE USING THE SAME

(71) Applicant: Samsung Electronics Co., Ltd., Suwon-si (KR)

(72) Inventor: Byungje Jung, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 728 days.

(21) Appl. No.: 18/318,042

(22) Filed: May 16, 2023

(65) Prior Publication Data

US 2024/0085778 A1 Mar. 14, 2024

(30) Foreign Application Priority Data

Sep. 8, 2022 (KR) ........................ 10-2022-0114464

(51) Int. Cl.

| | |
|---|---|
| ***G03F 1/42*** | (2012.01) |
| ***G03F 1/36*** | (2012.01) |
| ***G03F 1/44*** | (2012.01) |
| ***G03F 1/60*** | (2012.01) |
| ***G03F 1/72*** | (2012.01) |
| ***G03F 1/80*** | (2012.01) |

(52) U.S. Cl.

CPC .................. *G03F 1/42* (2013.01); *G03F 1/36* (2013.01); *G03F 1/44* (2013.01); *G03F 1/60* (2013.01); *G03F 1/72* (2013.01); *G03F 1/80* (2013.01)

(58) Field of Classification Search

CPC ..... G03F 1/42; G03F 1/36; G03F 1/44; G03F 1/60; G03F 1/72; G03F 1/80

See application file for complete search history.

(56) References Cited

U.S. PATENT DOCUMENTS

| | | | |
|---|---|---|---|
| 7,993,815 | B2 | 8/2011 | Colburn et al. |
| 8,103,977 | B2 | 1/2012 | Taoka et al. |
| 9,530,731 | B2 | 12/2016 | Fang et al. |
| 9,915,625 | B2 | 3/2018 | Gao et al. |
| 10,060,947 | B2 | 8/2018 | Budach et al. |

(Continued)

FOREIGN PATENT DOCUMENTS

| | | |
|---|---|---|
| JP | 2004253182 A | 9/2004 |

*Primary Examiner* — Jack Chiang
*Assistant Examiner* — Rayappu Soundranayagam
(74) *Attorney, Agent, or Firm* — Wolf, Greenfield & Sacks, P.C.

(57) ABSTRACT

A photomask includes at least one line pattern monitoring mark having unit blocks that include design line patterns. Each of the unit blocks includes three design line patterns sequentially offset in a second direction perpendicular to the first direction, the unit blocks include a first unit block and a second unit block adjacent to the first unit block, the second unit block is offset from the first unit block by a rounding length in the second direction and is spaced apart from the first unit block in the first direction. In a method of manufacturing an integrated circuit device, monitoring line patterns are formed using the photomask, and a line end profile error in the monitoring line patterns is determined based on a cross-sectional structure of the monitoring line patterns taken along a line extending through at least a portion of the monitoring line patterns in the first direction.

20 Claims, 25 Drawing Sheets

(56) References Cited

U.S. PATENT DOCUMENTS

| | | | | |
|---|---|---|---|---|
| 10,409,169 | B2 | 9/2019 | Kim et al. | |
| 10,866,197 | B2 | 12/2020 | Tolani et al. | |
| 11,054,736 | B2 | 7/2021 | Choi et al. | |
| 11,302,589 | B2 | 4/2022 | Majumdar et al. | |
| 2005/0139925 | A1 | 6/2005 | You | |
| 2009/0075178 | A1 | 3/2009 | Jahnke et al. | |
| 2013/0252429 | A1* | 9/2013 | Okamoto | G03F 1/42<br>430/5 |
| 2013/0320507 | A1 | 12/2013 | Yasuzato | |

* cited by examiner

PHOTOMASK INCLUDING LINE PATTERN MONITORING MARK AND METHOD OF MANUFACTURING INTEGRATED CIRCUIT DEVICE USING THE SAME

CROSS-REFERENCE TO RELATED APPLICATION

This application is based on and claims priority under 35 U.S.C. § 119 to Korean Patent Application No. 10-2022-0114464, filed on Sep. 8, 2022, in the Korean Intellectual Property Office, the disclosure of which is incorporated by reference herein in its entirety.

BACKGROUND

The inventive concept relates to a photomask and a method of manufacturing an integrated circuit device using the same, and more particularly, to a photomask including a line pattern monitoring mark and a method of manufacturing an integrated circuit device using the same.

Recently, as down-scaling of integrated circuit devices has rapidly progressed, feature sizes of integrated circuit devices have been miniaturized and line widths of patterns constituting the integrated circuit devices have been gradually reduced.

SUMMARY

The inventive concept provides a photomask that may be used to monitor pattern profile errors of a plurality of line patterns disposed parallel to each other at a fine pitch with a fine width.

The inventive concept also provides a method of manufacturing an integrated circuit device capable of improving the precision of a pattern shape by monitoring pattern profile errors of the plurality of line patterns when forming a plurality of line patterns arranged in parallel with each other at a fine pitch with a fine width.

According to aspects of the inventive concept, there is provided a photomask including a pattern area for configuring a pattern in a chip area of a substrate, and at least one line pattern monitoring mark spaced apart from the pattern area, wherein the at least one line pattern monitoring mark comprises a plurality of unit blocks that comprise a plurality of design line patterns, and the plurality of design line patterns are arranged at a constant pitch along a first horizontal direction, wherein each of the plurality of unit blocks comprises three design line patterns from the plurality of design line patterns, and adjacent ones of the plurality of unit blocks are offset from each other in a second horizontal direction perpendicular to the first horizontal direction, and wherein the plurality of unit blocks comprise a first unit block and a second unit block adjacent to the first unit block in the first horizontal direction, the second unit block is offset from the first unit block by a rounding length in the second horizontal direction, and the second unit block is spaced apart from the first unit block in the first horizontal direction.

According to aspects of the inventive concept, there is provided a method of manufacturing an integrated circuit device, the method including forming a feature layer on the substrate, forming an etching mask on the feature layer, forming, on the substrate, an etching mask pattern including a plurality of line patterns by exposing the etching mask using a photomask, etching the feature layer using the etching mask pattern to form a feature pattern including a plurality of feature line patterns, and determining a line end profile error in a plurality of monitoring line patterns based on a cross-sectional structure of the plurality of monitoring line patterns taken along a cut line extending through at least a portion of the plurality of monitoring line patterns in the first horizontal direction, the plurality of monitoring line patterns comprising one of the plurality of line patterns or the plurality of feature line patterns.

According to aspects of the inventive concept, there is provided a method of manufacturing an integrated circuit device, the method including forming a plurality of monitoring line patterns on a substrate by performing an exposure process using a photomask that includes at least one line pattern monitoring mark having a plurality of unit blocks that comprise a plurality of design line patterns, the plurality of design line patterns being arranged at a constant pitch along a first horizontal direction, determining a position of a design cut line extending through at least two design line patterns from the plurality of design line patterns in the first horizontal direction, and determining a line end profile error in a plurality of monitoring line patterns based on a cross-sectional structure of the plurality of monitoring line patterns taken along a cut line extending through at least a portion of the plurality of monitoring line patterns in the first horizontal direction, wherein a position of the cut line corresponds to the position of the design cut line, wherein each of the plurality of unit blocks comprises three design line patterns from the plurality of design line patterns, and adjacent ones of the plurality of unit blocks are offset from each other in a second horizontal direction perpendicular to the first horizontal direction, and wherein the plurality of unit blocks comprise a first unit block and a second unit block adjacent to the first unit block in the first horizontal direction, the second unit block being offset from the first unit block by a rounding length in the second horizontal direction, and the second unit block being spaced apart from the first unit block in the first horizontal direction.

BRIEF DESCRIPTION OF THE DRAWINGS

Example embodiments of the inventive concept will be more clearly understood from the following detailed description taken in conjunction with the accompanying drawings in which.

DETAILED DESCRIPTION OF THE EMBODIMENTS

Figure 1:
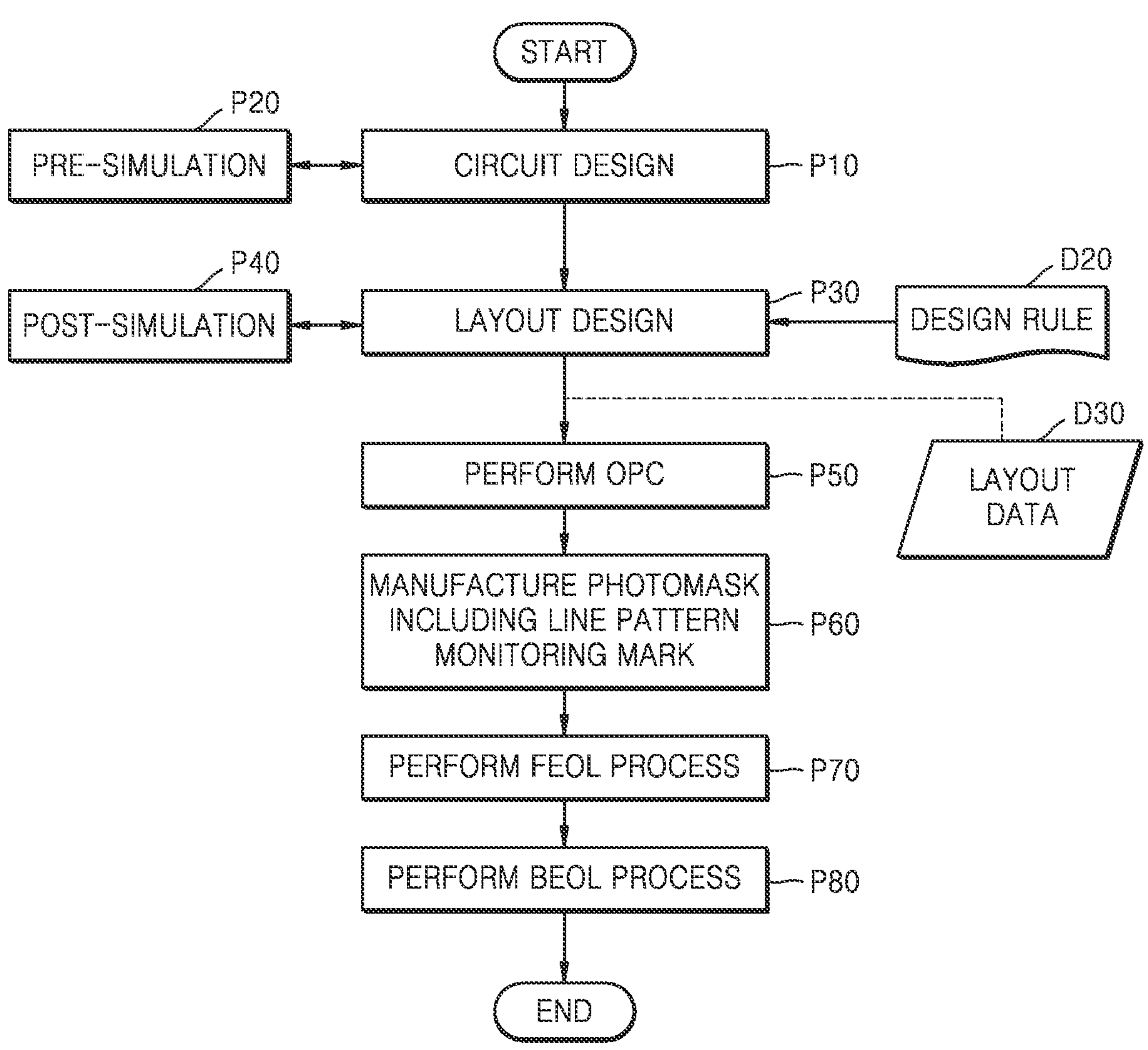
FIG. 1 is a flowchart for explaining a method of manufacturing an integrated circuit device according to some embodiments.

Hereinafter, example embodiments of the inventive concept will be described in detail with reference to the accompanying drawings. The same reference numerals are used for the same components in the drawings, and duplicate descriptions thereof are omitted.

When manufacturing highly scaled integrated circuit devices, it may be necessary to develop a technique for forming a plurality of line patterns that are repeatedly formed at a minute pitch with a minute width and a technique for precisely and reliably monitoring the plurality of line patterns formed by applying such a technique.

FIG. 1 is a flowchart for explaining a method of manufacturing an integrated circuit device, according to some embodiments.

Referring to FIG. 1, circuit design may be performed in process P10. For example, various elements (e.g., transistors, etc.) may be designed to meet the performance of an integrated circuit device to be formed. In example embodiments, circuit design may be performed in a circuit design tool that provides a user interface to the designer.

Circuit design according to process P10 may be performed with reference to the result of the pre-simulation performed in process P20. For example, pre-simulation may be performed to test the performance of the designed circuit, and the structure of the circuit may be modified according to the pre-simulation result.

In process P30, layout design may be performed. In example embodiments, layout design may be performed in a layout design tool.

Layout design according to process P30 may be performed by referring to the post-simulation result performed in process P40. The layout designed in process P30 may be modified according to the result of the post-simulation.

Layout design according to process P30 may be performed based on a design rule D20. The design rule D20 may define a plurality of rules based on a process of manufacturing an integrated circuit device. For example, the design rule D20 may define a pitch of patterns, a space between patterns, and the like, which are allowed in the same conductive layer. The layout of the integrated circuit device may be designed to comply with a plurality of rules defined in the design rule D20. As used herein, the term "pattern" may generally refer to a geometric shape or design that is transferred from a photomask or the like onto a substrate of an integrated circuit. In some embodiments, the substrate may be coated with a light-sensitive material (e.g., a photoresist).

When the layout design is completed in process P30, layout data D30 defining the layout may be generated. The layout data D30 may include geometric information of patterns included in an integrated circuit device to be formed.

In process P50, optical proximity correction (OPC) may be performed. The OPC may collectively refer to operations for forming a pattern of a desired shape by correcting distortion phenomena such as refraction caused by the characteristics of light in a photolithography process performed during a process of manufacturing an integrated circuit device.

By applying the OPC to the layout data D30, which is a result of the layout designed in process P30, a pattern on the photomask manufactured in subsequent process P60 may be determined. In some embodiments, the layout of integrated circuit devices may be limitedly modified in the OPC performing process according to process P50.

In process P60, a photomask including line pattern monitoring marks may be manufactured.

In some embodiments, by applying OPC to the layout data D30, patterns necessary for forming a plurality of patterns on a substrate and the line pattern monitoring mark may be defined on a photomask, and at least one photomask for forming patterns of each of a plurality of layers and the line pattern monitoring mark may be manufactured. The photomask may include a main pattern area (also referred to as a "pattern area") on which a main pattern (also referred to as a "pattern") required to construct an integrated circuit is disposed in a chip area of a substrate, and the at least one line pattern monitoring mark may be disposed at a position spaced apart from the main pattern area in the photomask. For example, the pattern area may be for configuring a pattern in a chip area of a substrate. For example, the pattern may be a pattern used to form an integrated circuit.

In process P70, a front-end-of-line (FEOL) process of manufacturing an integrated circuit device may be performed.

In the FEOL process, individual elements may be formed on the substrate. The individual elements may include transistors, capacitors, resistors, etc., but are not limited thereto. The FEOL process may include a planarization process, a cleaning process, an etching process, a deposition process, an ion implantation process, a conductive film formation process, an insulating film formation process, and the like.

In process P80, a back-end-of-line (BEOL) process of manufacturing the integrated circuit device may be performed.

The BEOL process may include processes of electrically interconnecting individual elements formed in process P70. The BEOL process may include a plurality of conductive film formation processes, a plurality of conductive via contact formation processes, a silicidation process, a plating process, an insulating film deposition process, a passivation film formation process, and the like. A product obtained by performing the BEOL process according to process P80 may be packaged and used as a component for various applications.

The BEOL process according to process P80 may include a process of forming, on the substrate, a plurality of monitoring line patterns corresponding to the line pattern monitoring marks by performing an exposure process using the photomask manufactured in process P60, and a process of determining line end profile errors in the plurality of monitoring line patterns. The process of determining the line end profile errors may include a process of determining a bulging error on a sidewall of an end portion of at least one monitoring line pattern selected from among the plurality of monitoring line patterns, and may further include a process of determining void errors in a plurality of conductive lines obtained from the plurality of monitoring line patterns.

Figure 2A:
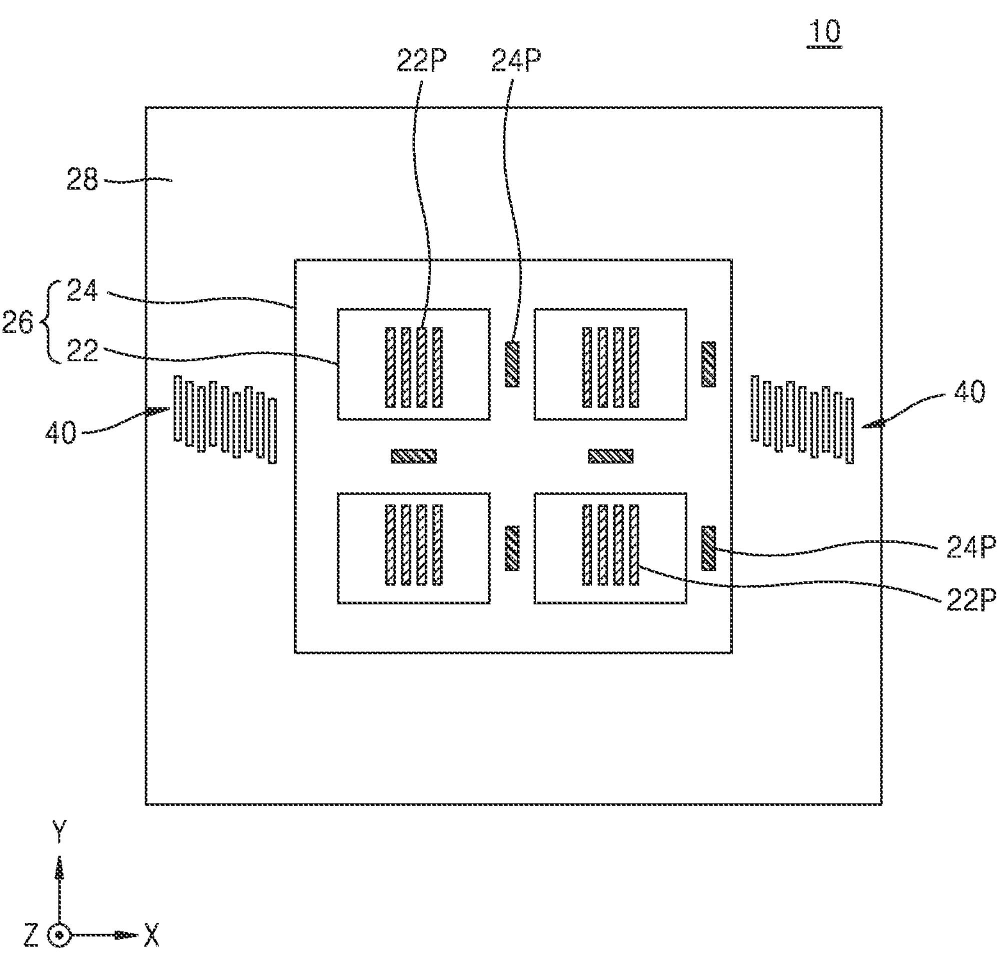
FIG. 2A is a plan view illustrating a schematic structure of a photomask according to some embodiments.

FIG. 2A is a plan view illustrating a schematic structure of a photomask 10 according to some embodiments.

Referring to FIG. 2A, the photomask 10 may include a chip area 26 composed of a cell array area 22 and a peripheral circuit area 24. The chip area 26 may constitute a main pattern area of the photomask 10.

A plurality of main patterns 22P and 24P required to form the integrated circuit in a chip area of a substrate constituting the integrated circuit device may be respectively disposed in the cell array area 22 and the peripheral area 24. The plurality of main patterns 22P and 24P may include a plurality of line patterns extending parallel to each other.

In example embodiments, the plurality of main patterns 22P and 24P may include a chrome (Cr) light blocking pattern, a phase shift pattern, or a combination thereof. In other embodiments, the plurality of main patterns 22P and 24P may include areas defined by a light blocking pattern, a phase shift pattern, or a combination thereof.

The photomask 10 may include a plurality of line pattern monitoring marks 40. The plurality of line pattern monitoring marks 40 may be disposed at positions spaced apart from the main patterns 22P and 24P. The plurality of line pattern monitoring marks 40 may be disposed in an outer area 28 spaced apart from the main pattern area, which is the chip area 26, in the photomask 10. In the photomask 10, an area where the plurality of line pattern monitoring marks 40 are disposed may correspond to an area spaced apart from a pattern area where patterns required to configure unit elements of an integrated circuit device are formed. For example, an area in the photomask 10 where the plurality of line pattern monitoring marks 40 are disposed may correspond to a scribe lane area on a substrate for forming an integrated circuit device.

Figure 2B:
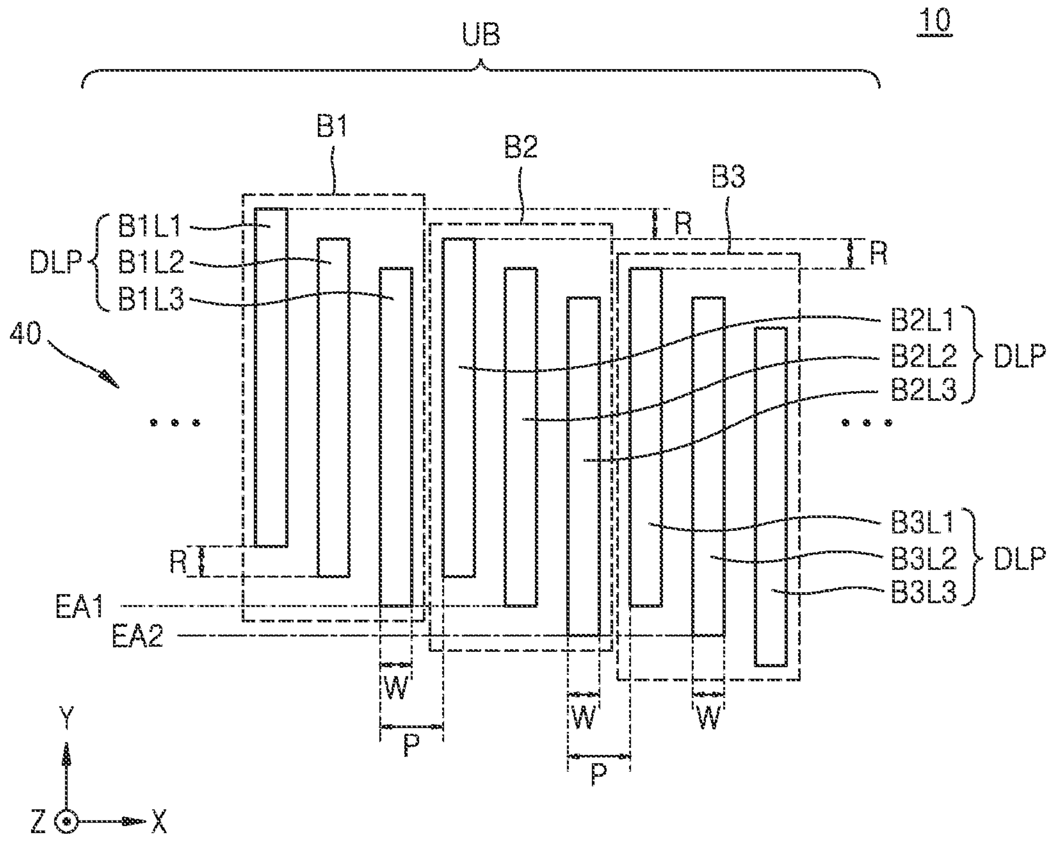
FIG. 2B is a plan view for explaining in detail a line pattern monitoring mark included in a photomask according to some embodiments.

FIG. 2B is a plan view for explaining in detail the line pattern monitoring marks 40 included in the photomask 10 according to some embodiments.

The line pattern monitoring mark 40 may include a plurality of unit blocks UB including a plurality of design line patterns DLP disposed at a constant pitch P in the first horizontal direction (X direction). The pitch P may correspond to a value obtained by adding a width W of a respective one of the plurality of design line patterns DLP to a separation distance between the respective one of the plurality of design line patterns DLP and another one of the plurality of design line patterns DLP adjacent to the respective one of the plurality of design line patterns DLP. As an example, the pitch P may correspond to a value obtained by adding a width W of a third design line pattern B1L3 of a first unit block B1 to a separation distance between the third design line pattern B1L3 of the first unit block B1 and a first design line pattern B2L1 of a second unit block B2.

The plurality of design line patterns DLP may have the same polygon plane shape. For example, each of the plurality of design line patterns DLP may have a same polygon shape in a plan view. In example embodiments, each of the plurality of design line patterns DLP may have a rectangular planar shape having the same size. Each of the plurality of design line patterns DLP may have a constant width W in the first horizontal direction (X direction). Among the plurality of design line patterns DLP, two adjacent design line patterns DLP in the first horizontal direction (X direction) may be spaced apart from each other in the first horizontal direction (X direction) with a preset separation distance corresponding to a value obtained by subtracting the width W from the pitch P. Among the plurality of design line patterns DLP, two adjacent design line patterns DLP in the first horizontal direction (X direction) may be spaced apart from each other in the first horizontal direction (X direction) with the separation distance therebetween.

The plurality of unit blocks UB may be disposed at a position shifted by a rounding length R in the second horizontal direction (Y direction) from a position moved by the separation distance along the first horizontal direction (X direction) from the other unit block UB disposed on one side, respectively. For example, adjacent ones of the plurality of unit blocks UB may be offset from each other by a rounding length R in the second horizontal direction (Y direction), and may be spaced apart from each other by the separation distance in the first horizontal direction (X direction). As used herein, "an element A and an element B are offset" (or similar language) may mean that elements A and B are not aligned along the second direction.

Each of the plurality of unit blocks UB may include three design line patterns DLP selected from the plurality of design line patterns DLP and arranged sequentially adjacent to each other, and the three design line patterns DLP may be arranged to be sequentially shifted by the rounding length R in the second horizontal direction (Y direction).

The plurality of unit blocks UB may include a first unit block B1, a second unit block B2, and a third unit block B3 sequentially disposed along the first horizontal direction (X direction). The first unit block B1 and the second unit block B2 may be adjacent to each other in the first horizontal direction (X direction), and the second unit block B2 and the third unit block B3 may be adjacent to each other in the first horizontal direction (X direction). In the plurality of unit blocks UB, the second unit block B2 may be disposed at a position shifted by the rounding length R in the second horizontal direction (Y direction) from the position moved by the separation distance along the first horizontal direction (X direction) from the first unit block B1. The third unit block B3 may be disposed at a position shifted by the rounding length R in the second horizontal direction (Y direction) from the position moved by the separation distance along the first horizontal direction (X direction) from the second unit block B2. For example, the second unit block B2 may be offset from the first unit block B1 by the rounding length R in the second horizontal direction (Y direction), and the third unit block B3 may be offset from the second unit block B2 by the rounding length R in the second horizontal direction (Y direction). For example, the second unit block B2 may be spaced apart from the first unit block B1 by the separation distance in the first horizontal direction (X direction), and the third unit block B3 may be spaced apart from the second unit block B2 by the separation distance in the first horizontal direction (X direction). An offset between adjacent ones of the unit blocks UB may refer to an offset between the first design line patterns B1L1, B2L1, and/or B3L1 thereof. As an example, the second unit block B2 being offset from the first unit block B1 by the rounding length R in the second horizontal direction (Y direction) may refer to the first design line pattern B2L1 of the second unit block B2 being misaligned with the first design line pattern B1L1 of the first unit block B1 by the rounding length R in the second horizontal direction (Y direction). As another example, the third unit block B3 being offset from the second unit block B2 by the rounding length R in the second horizontal direction (Y direction) may refer to the first design line pattern B3L1 of the third unit block B3 being misaligned with the first design line pattern B2L1 of the second unit block B2 by the rounding length R in the second horizontal direction (Y direction).

The first unit block B1 may include a first design line pattern B1L1, a second design line pattern B1L2, and a third design line pattern B1L3 sequentially disposed along a first horizontal direction (X direction). The second unit block B2 may include a first design line pattern B2L1, a second design line pattern B2L2, and a third design line pattern B2L3 sequentially disposed along a first horizontal direction (X direction). The third unit block B3 may include a first design line pattern B3L1, a second design line pattern B3L2, and a third design line pattern B3L3 sequentially disposed along a first horizontal direction (X direction).

In the first unit block B1, the second design line pattern B1L2 may be disposed at a position shifted by the rounding length R in the second horizontal direction (Y direction) from the position moved by the separation distance along the first horizontal direction (X direction) from the first design line pattern B1L1. The third design line pattern B1L3 may be disposed at a position shifted by the rounding length R in the second horizontal direction (Y direction) from the position moved by the separation distance along the first horizontal direction (X direction) from the second design line pattern B1L2. For example, the second design line pattern B1L2 may be offset from the first design line pattern B1L1 by the rounding length R in the second horizontal direction (Y direction), and the third design line pattern B1L3 may be offset from the second design line pattern B1L2 by the rounding length R in the second horizontal direction (Y direction). For example, the second design line pattern B1L2 may be spaced apart from the first design line pattern B1L1 by the separation distance in the first horizontal direction (X direction), and the third design line pattern B1L3 may be spaced apart from the second design line pattern B1L2 by the separation distance in the first horizontal direction (X direction). An offset between adjacent ones of the first to third design line patterns B1L1 to B1L3 of the first unit block B1 may refer to center portions of the adjacent ones of the first to third design line patterns B1L1 to B1L3 being offset from each other. As an example, the second design line pattern B1L2 being offset from the first design line pattern B1L1 by the rounding length R in the second horizontal direction (Y direction) may refer to a center portion of the second design line pattern B1L2 being offset from a center portion of the first design line pattern B1L1 by the rounding length R in the second horizontal direction (Y direction). As another example, the third design line pattern B1L3 being offset from the second design line pattern B1L2 by the rounding length R in the second horizontal direction (Y direction) may refer to a center portion of the third design line pattern B1L3 being offset from the center portion of the second design line pattern B1L2 by the rounding length R in the second horizontal direction (Y direction).

The first design line pattern B2L1, the second design line pattern B2L2, and the third design line pattern B2L3 included in the second unit block B2, and the first design line pattern B3L1, the second design line pattern B3L2, and the third design line pattern B3L3 included in the third unit block B3 may have the same arrangement structure as the first design line pattern B1L1, the second design line pattern B1L2, and the third design line pattern B1L3 included in the first unit block B1.

One end of the third design line pattern B1L3 of the first unit block B1 and one end of the second design line pattern B2L2 of the second unit block B2 may intersect with one straight line EA1 along the first horizontal direction (X direction). One end of the third design line pattern B2L3 of the second unit block B2 and one end of the second design line pattern B3L2 of the third unit block B3 may intersect with another straight line EA2 along the first horizontal direction (X direction). In some embodiments, one end of the first design line pattern B3L1 of the third unit block B3 may intersect with the one straight line EA1 along the first horizontal direction (X direction).

The photomask 10 illustrated in FIGS. 2A and 2B may be used to accurately monitor pattern profile errors of a plurality of line patterns disposed parallel to each other at a fine pitch with a fine width.

Figure 3:
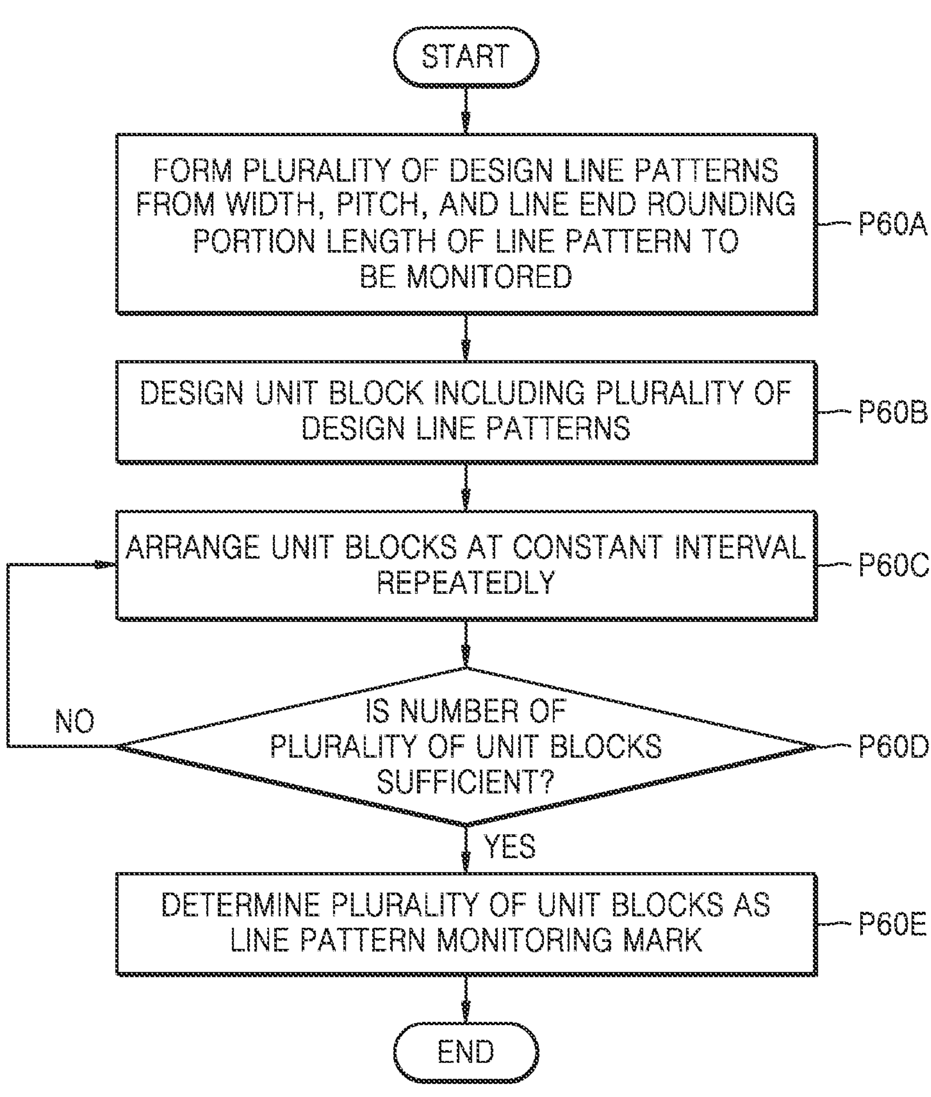
FIG. 3 is a flowchart for explaining a method of manufacturing a photomask according to some embodiments.

FIG. 3 is a flowchart for explaining a method of manufacturing a photomask, according to some embodiments. FIGS. 4, 5, 6A, 6B, and 7 are plan views for explaining in detail some processes in the method of manufacturing a photomask described with reference to FIG. 3.

Figure 4:
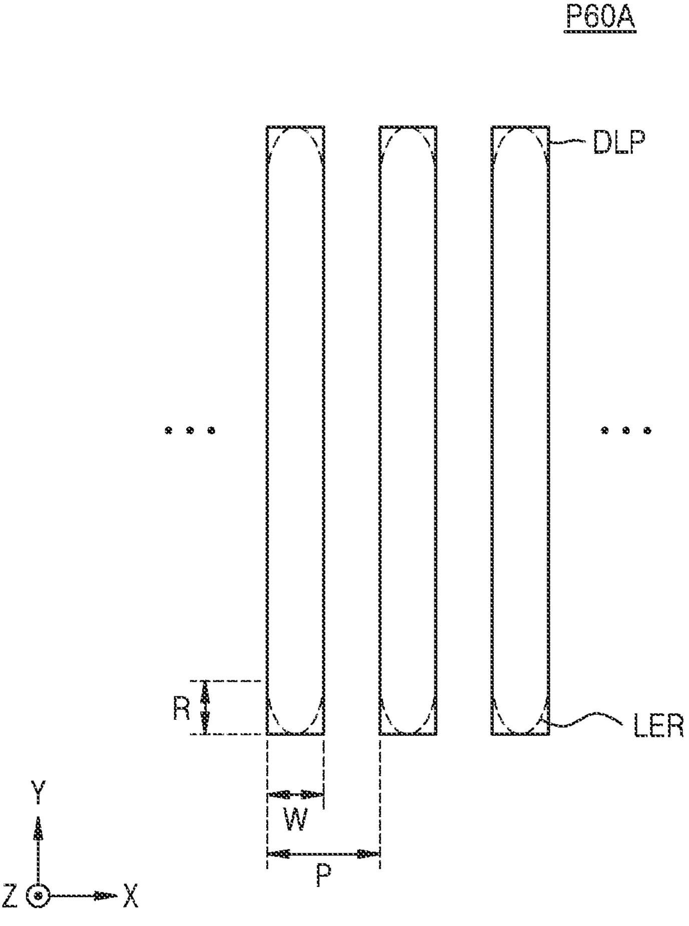
FIGS. 4, 5, 6A, 6B, and 7 are plan views for explaining in detail some processes in the method of manufacturing a photomask described with reference to FIG. 3.

Referring to FIGS. 3 and 4, in process P60A, among a plurality of line patterns to be formed on a substrate for manufacturing an integrated circuit device, the plurality of design line patterns DLP may be formed from the width W and pitch P of line patterns to be monitored and the rounding length R along the second horizontal direction (Y direction) of the line end rounding portion LER.

In example embodiments, the rounding length R may be equal to the length of the line end rounding portion LER in the second horizontal direction (Y direction), which is a round line end included in a virtual line pattern obtained from a simulation result using an OPC model of one design line pattern DLP selected from among the plurality of design line patterns DLP.

In other embodiments, the rounding length R may be equal to the length of the round-shaped line ends (e.g., a round line end) in the second horizontal direction (Y direction) included in the plurality of line patterns already implemented in the chip area of another substrate.

Figure 5:
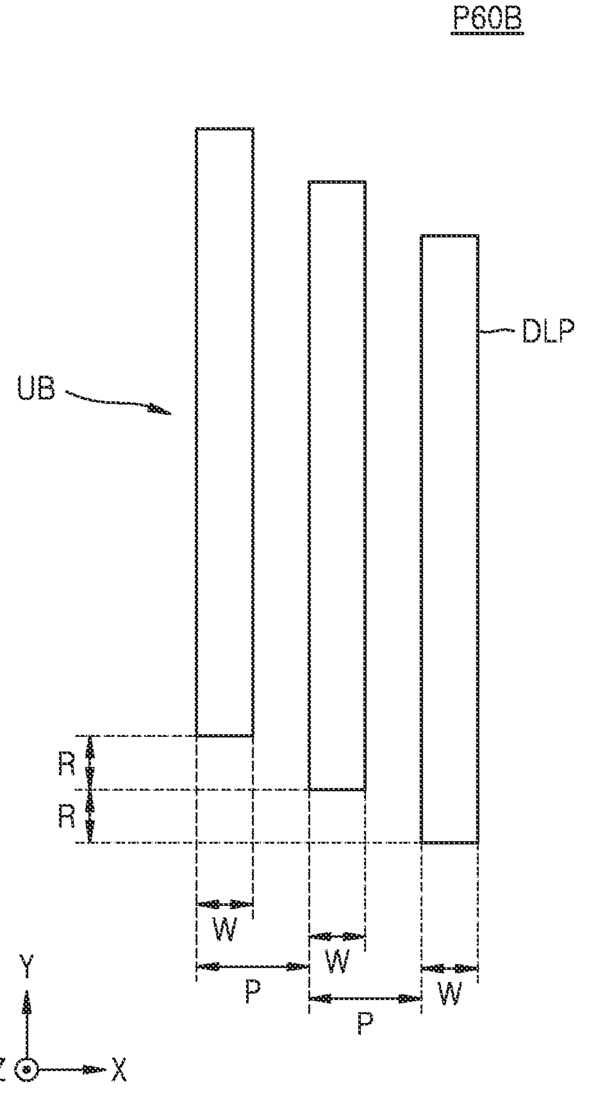

Referring to FIGS. 3 and 5, in process P60B, a unit block UB including the plurality of design line patterns DLP may be designed.

More specifically, three design line patterns DLP selected from among the plurality of design line patterns DLP obtained in process P60A may be set as one unit block UB, and in order that the three design line patterns DLP may have the same arrangement structure as the arrangement structure of the first design line pattern B1L1, the second design line pattern B1L2, and the third design line pattern B1L3 included in the first unit block B1 described with reference to FIG. 2B, the unit block UB may be designed by arranging three design line patterns DLP. For example, the three design line patterns DLP may be arranged to have the same structure as the first design line pattern B1L1, the second design line pattern B1L2, and the third design line pattern B1L3 included in the first unit block B1 described with reference to FIG. 2B.

Figure 6A:
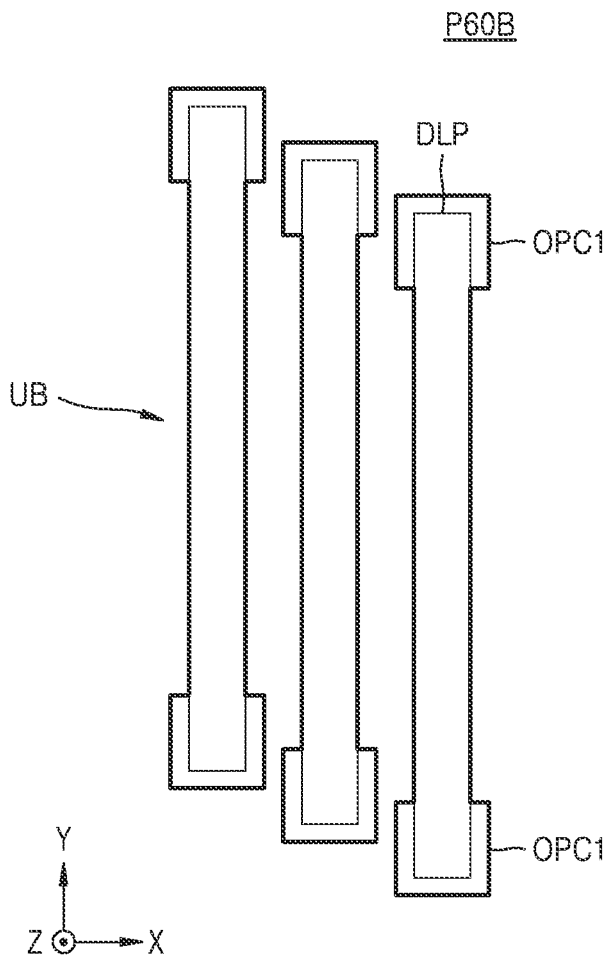
Figure 6B:
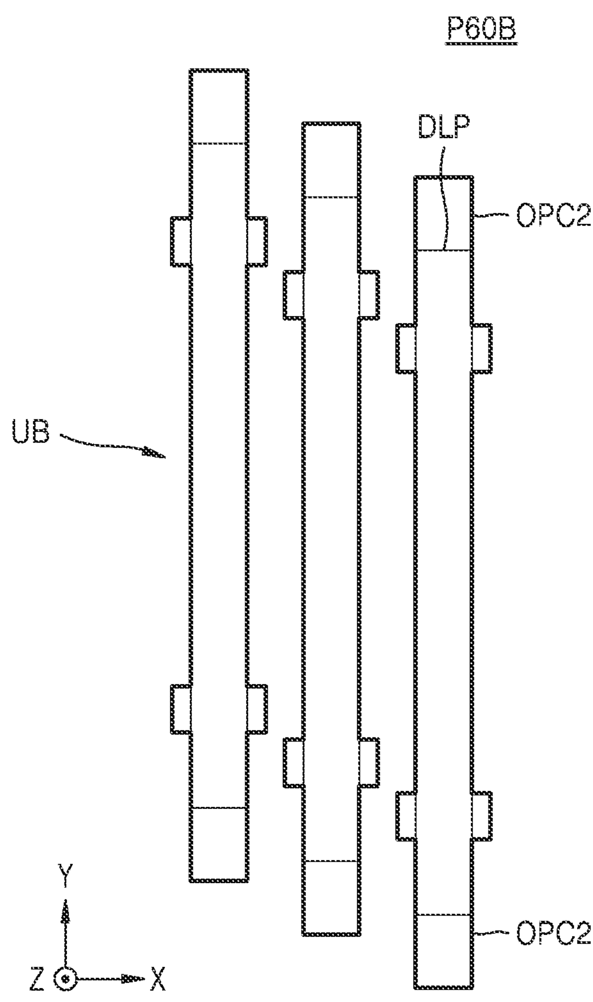

In other embodiments, an OPC process may be added to the process of designing the unit block UB in process P60B. For example, an OPC pattern OPC1 as illustrated in FIG. 6A or an OPC pattern OPC2 as illustrated in FIG. 6B may be added at the design line end part of each of the three design line patterns DLP constituting one unit block UB. As the width of the OPC patterns OPC1 and OPC2 in the first horizontal direction (X direction) increases, a radius of curvature of a line end rounding portion LER (see FIG. 4) that may be formed in a line end portion (also referred to as an "end portion") of a line pattern implemented on a substrate may be increased. For example, the curvature radius of the line end rounding portion LER formed at the line end portion of the line pattern implemented on the substrate using the design line pattern DLP to which the OPC pattern OPC1 is added as illustrated in FIG. 6A may be greater than the radius of curvature of the line end rounding portion LER formed at the line end portion of the line pattern implemented on the substrate by using the design line pattern DLP to which the OPC pattern OPC2 is added as illustrated in FIG. 6B.

Figure 7:
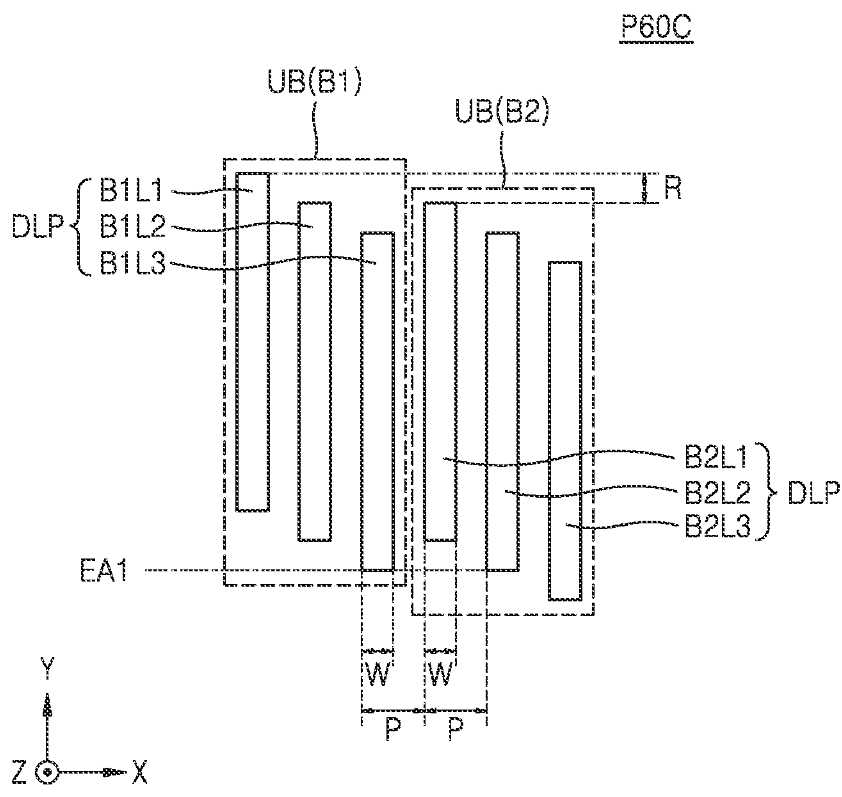

Referring to FIGS. 3 and 7, in process P60C, unit blocks UB designed in process P60B may be repeatedly arranged in a constant space.

For example, as illustrated in FIG. 7, a second unit block B2 having the same structure as the first unit block B1 designed in process P60B of FIG. 3 may be placed on one side of the first unit block B1 along the first horizontal direction (X direction), and the separation distance between the third design line pattern B1L3 of the first unit block B1 and the first design line pattern B2L1 of the second unit block B2 may be equal to the separation distance between each of the first design line pattern B1L1, the second design line pattern B1L2, and the third design line pattern B1L3 included in the first unit block B1, and the second unit block B2 may be disposed at a position shifted by the rounding length R in the second horizontal direction (Y direction) from a position moved by the distance from the first unit block B1. For example, the separation distance between the third design line pattern B1L3 of the first unit block B1 and the first design line pattern B2L1 of the second unit block B2 may be equal to the separation distance between the first design line pattern B1L1 and the second design line pattern B1L2 included in the first unit block B1 and may also be equal to the separation distance between the second design line pattern B1L2 and the third design line pattern B1L3 included in the first unit block B1. For example, the second unit block B2 may be at a position shifted by the rounding length R in the second horizontal direction (Y direction) from a position of the first unit block B1.

After that, the third unit block B3 (see FIG. 2B) may be disposed on one side of the second unit block B2 in the same manner as the arrangement of the second unit block B2. If necessary, the number of unit blocks UB repeatedly disposed along the first horizontal direction (X direction) may be increased. Considering the error level that may occur in determining line end profile errors in a plurality of monitoring line patterns implemented on the substrate, in process P60C, a sufficient number of unit blocks UB may be repeatedly arranged.

The plurality of unit blocks UB repeatedly arranged in process P60C of FIG. 3 may include the unit block UB illustrated in FIG. 5, the unit block UB illustrated in FIG. 6A, the unit block UB illustrated in FIG. 6B, or unit blocks having various structures that are modified within the scope of the present disclosure.

In process P60D of FIG. 3, it may be determined whether the number of unit blocks UB repeatedly arranged in process P60C is sufficient. When it is determined that the number of unit blocks UB is insufficient, process P60C of FIG. 3 may be repeated. When it is determined that the number of unit blocks UB is sufficient, process P60E of FIG. 3 may be performed.

In process P60E of FIG. 3, a plurality of unit blocks UB repeatedly disposed in process P60C may be determined as line pattern monitoring marks.

In example embodiments, one photomask may include a plurality of line pattern monitoring marks determined in process P60E of FIG. 3. A plurality of line pattern monitoring marks included in one photomask may include a line pattern monitoring mark made of only the unit block UB illustrated in FIG. 5, a line pattern monitoring mark made of only the unit block UB illustrated in FIG. 6A, a line pattern monitoring mark made of only the unit block UB illustrated in FIG. 6B, a line pattern monitoring mark consisting of a combination thereof, or line pattern monitoring marks having various structures that are modified within the scope of the present disclosure.

Figure 8:
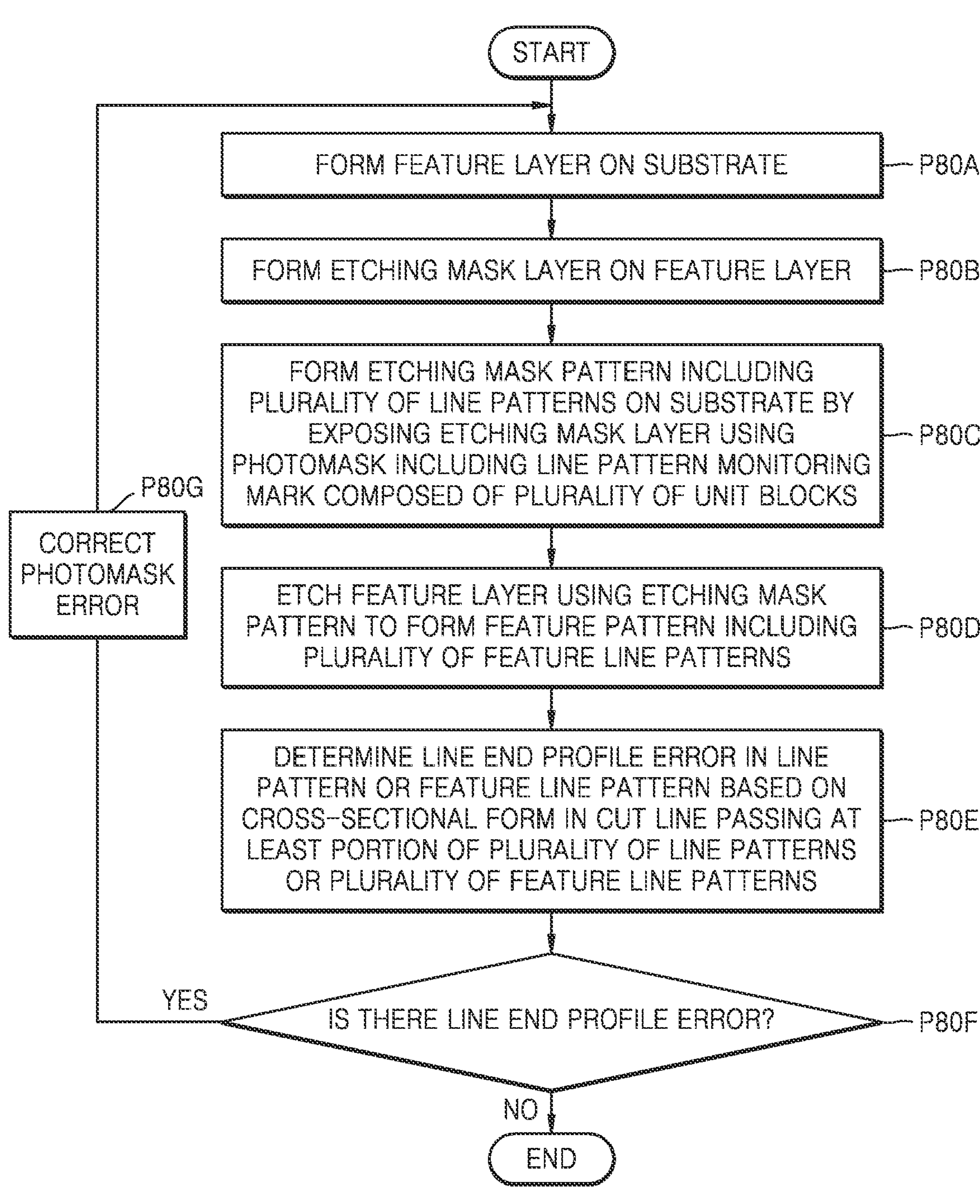
FIG. 8 is a flowchart for explaining a method of manufacturing an integrated circuit device according to some embodiments.

FIG. 8 is a flowchart for explaining a method of manufacturing an integrated circuit device, according to some embodiments. FIGS. 9A to 9D, 10, 11A, 11B, 12A, 12B, 13A, and 13B are diagrams for explaining some processes included in a method of manufacturing an integrated circuit device according to some embodiments.

Figure 9A:
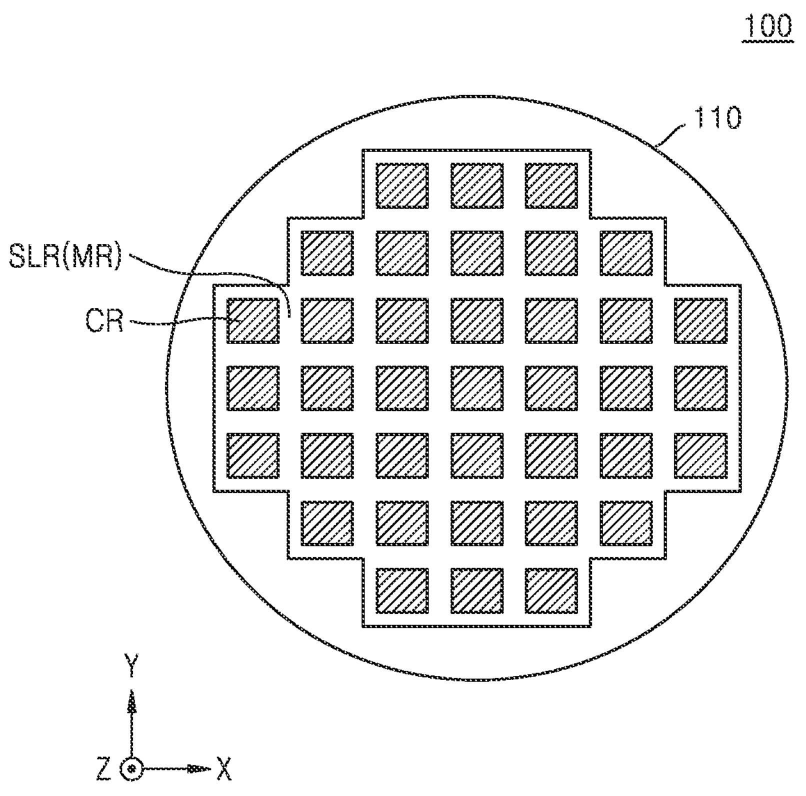
FIG. 9A is a schematic plan view of an integrated circuit device that may be obtained according to a method of manufacturing an integrated circuit device according to some embodiments.
Figure 9B:
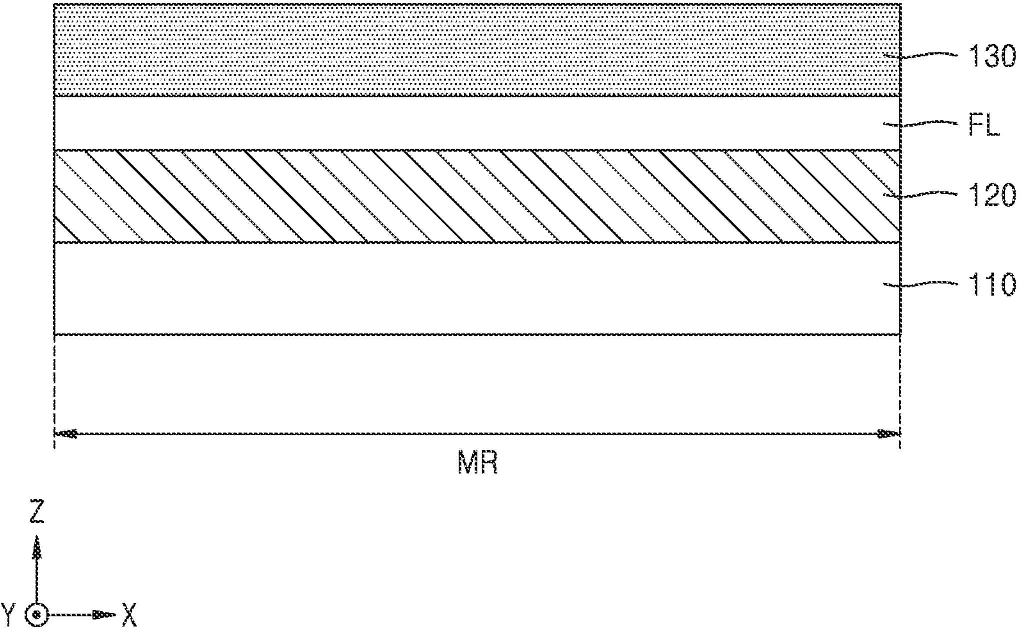
FIGS. 9B, 9C, and 9D are cross-sectional views according to a process order to explain a method of manufacturing an integrated circuit device according to some embodiments.
Figure 9C:
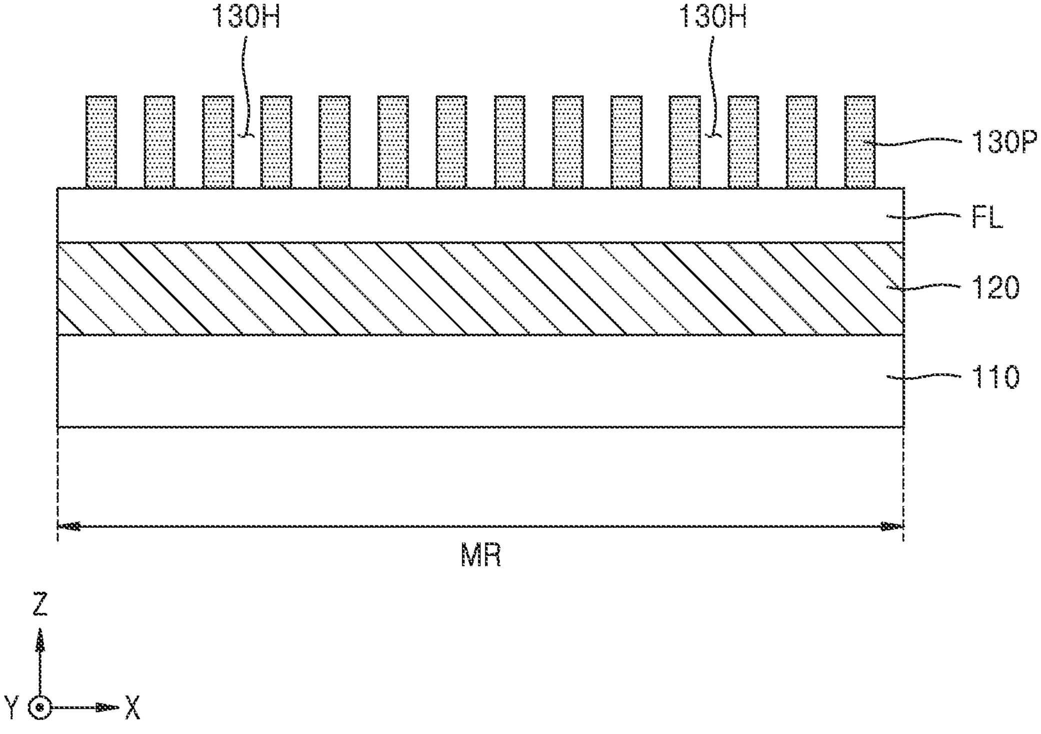
Figure 9D:
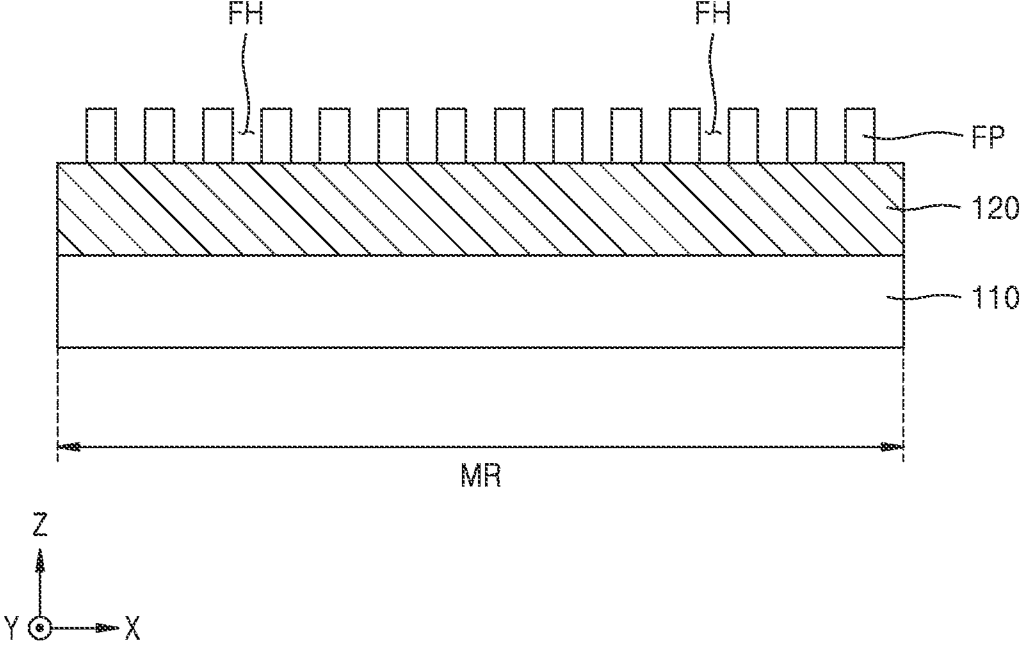

More specifically, FIG. 9A is a schematic plan view of an integrated circuit device 100 that may be obtained according to the method described with reference to FIG. 8. FIGS. 9B to 9D are cross-sectional views illustrating components in the monitoring area MR included in the scribe lane area SLR on a substrate 110 according to a process order to explain the manufacturing method of the integrated circuit device 100. FIGS. 10, 11A, 12A, and 13A are plan views of a photomask 10 that may be used in the manufacturing process of the integrated circuit device 100 illustrated in FIG. 9A, respectively, and are plan views illustrating a planar structure of the plurality of design line patterns DLP included in the photomask 10 used to form the feature pattern FP formed in the monitoring region MR of the substrate 110. FIGS. 11B, 12B, and 13B are cross-sectional views of components formed in the monitoring region MR of the substrate 110 during the manufacturing process of the integrated circuit device 100, respectively.

The method of manufacturing an integrated circuit device described with reference to FIG. 8 may be applied to performing a BEOL process according to process P80 of FIG. 1.

Referring to FIGS. 8, 9A, and 9B, in process P80A, a lower structure 120 may be formed on a plurality of chip areas CR of a substrate 110 and a scribe lane area SLR surrounding each thereof, and a feature layer FL may be formed on the lower structure 120. After that, an etching mask layer 130 may be formed on the feature layer FL in process P80B.

Referring to FIG. 9A, the integrated circuit device 100 may include a substrate 110 having a plurality of chip areas CR and a scribe lane area SLR surrounding each thereof. A plurality of chip areas CR on the substrate 110 may be arranged in a matrix form. The scribe lane area SLR may include a cut area for individualizing a plurality of chip areas CR. The scribe lane area SLR may include a monitoring area MR.

Each of the plurality of chip areas CR may be a high-density area having a relatively high pattern density, and the scribe lane area SLR may be a low-density area having a relatively low pattern density. The plurality of chip areas CR may include a cell array area of a semiconductor memory element, and a peripheral circuit area and a core area including circuits configured to be electrically connected to cell arrays included in the cell array area. In example embodiments, a volatile memory cell array such as dynamic random access memory (DRAM) or a non-volatile memory cell array such as flash memory may be formed in the cell array area. In the cell array area, a plurality of patterns having a relatively small width may be spaced apart from each other to form a regular arrangement and may be repeatedly formed at a relatively small pitch.

Referring to FIG. 9B, the substrate 110 may include a semiconductor such as Si or Ge, or a compound semiconductor such as SiGe, SiC, GaAs, InAs, or InP. The substrate 110 may include a conductive region, for example, a well doped with impurities or a structure doped with impurities.

The lower structure 120 may include an FEOL structure formed on the substrate 110. The lower structure 120 may include transistors, capacitors, resistors, and the like, but is not limited to thereto.

The feature layer FL may be formed from a conductive layer, a dielectric layer, an insulating layer, or a combination thereof. In one example, the feature layer FL may include a layer made of a metal, an alloy, a metal carbide, a metal nitride, a metal oxynitride, a metal oxycarbide, a semiconductor, polysilicon, an oxide, a nitride, an oxynitride, or a combination thereof, but is not limited to these. In another example, the feature layer FL may constitute a hard mask layer. In this case, the feature layer FL may be formed of various materials depending on the type of substrate 110. In example embodiments, the feature layer FL may be formed from an oxide layer, a nitride layer, a SiCN layer, a polysilicon layer, or a combination thereof. For example, the feature layer FL may be silicon oxide, SiOC, SiOCN, SiON, SiCN, SiN, SiCOH, an ultra low-k (ULK) material having an ultra low dielectric constant K of about 2.2 to about 2.4, or an insulating layer made of a combination thereof.

The etching mask layer 130 may be formed of a photoresist pattern or a combination of a hard mask pattern and the photoresist pattern. The hard mask pattern may be formed from an oxide layer, a nitride layer, a SiCN layer, a polysilicon layer, or a combination thereof, but is not limited thereto.

Referring to FIGS. 8 and 9C, in process P80C, an etching mask pattern 130P may be formed on the substrate 110 by performing a photolithography process including a process of exposing the etching mask layer 130 (see FIG. 9B) using a photomask 10 (see FIGS. 2A and 2B) including a line pattern monitoring mark 40 composed of a plurality of unit blocks UB. The etching mask pattern 130P may include a plurality of openings 130H having a planar shape of a plurality of rectangular lines. The plurality of openings 130H may configure a plurality of line patterns.

When exposing the etching mask layer 130 (see FIG. 9B), EUV (13.5 nm), KrF excimer laser (248 nm), ArF excimer laser, or $F_2$ excimer laser (157 nm) may be used as a light source.

In example embodiments, the etching mask pattern 130P may be obtained using a single exposure method. In other embodiments, to form the etching mask pattern 130P, various techniques such as a method using a double exposure method of forming a pattern through first exposure, first etching, second exposure, and second etching, a method using self-aligned double patterning (SADP), and a method using self-aligned universal patterning (SAUP) may be used.

Referring to FIGS. 8, 9C, 9D, 10, 11*b*, 12B, and 13B, in process P80D, by using the etching mask pattern 130P formed in process P80C as an etching mask, the feature layer FL may be etched to form a feature pattern FP including a plurality of openings FH (see FIGS. 9D, 11B, 12B, and 13B). The plurality of openings FH formed in the feature pattern FP may have a planar shape corresponding to that of the plurality of design line patterns DLP (see FIG. 10) included in the photomask 10. The lower structure 120 may be exposed through the plurality of openings FH included in the feature pattern FP (see FIGS. 9D, 11B, 12B, and 13B).

Referring to FIGS. 8, 10, 11B, 12B, and 13B, in process P80E, based on the cross-sectional structure of the plurality of monitoring line patterns MLP taken along a cut line passing or extending through at least a part of the plurality of monitoring line patterns MLP in the first horizontal direction (X direction), it is possible to determine line end profile errors in a plurality of monitoring line patterns MLP.

In some embodiments, the monitoring line pattern MLP used in process P80E may include a plurality of line patterns formed of a plurality of openings 130H included in an etching mask pattern 130P formed in process P80C. In other embodiments, the monitoring line pattern MLP used in process P80E may include a feature line pattern including a plurality of openings FH included in the feature pattern FP formed in process P80D.

FIGS. 11B, 12B, and 13B illustrate cases in which the monitoring line pattern MLP is formed of a feature line pattern including a plurality of openings FH included in the feature pattern FP formed in process P80D. In the following description, a case in which the monitoring line pattern MLP is formed of a feature line pattern including a plurality of openings FH included in the feature pattern FP formed in process P80D will be described as an example. However, the present disclosure is not limited thereto. A detailed description below of taking a feature line pattern including a plurality of openings FH included in the feature pattern FP as an example may be equally applied to a plurality of line patterns formed of a plurality of openings 130H included in an etching mask pattern 130P formed in process P80C.

In performing process P80E of FIG. 8, the position of the cut line passing or extending through at least a portion of the plurality of monitoring line patterns MLP in the first horizontal direction (X direction) may be determined as a location corresponding to a design cut line passing or extending through at least some of the design line patterns DLP selected from the plurality of design line patterns DLP (see FIG. 10) disposed on the photomask 10 in the first horizontal direction (X direction). For example, the position of the cut line passing or extending through at least a portion of the plurality of monitoring line patterns MLP in the first horizontal direction (X direction) may correspond to a position of the design cut line passing or extending through at least some of the design line patterns DLP from the plurality of design line patterns DLP (see FIG. 10) of the photomask 10 in the first horizontal direction (X direction).

Figure 10:
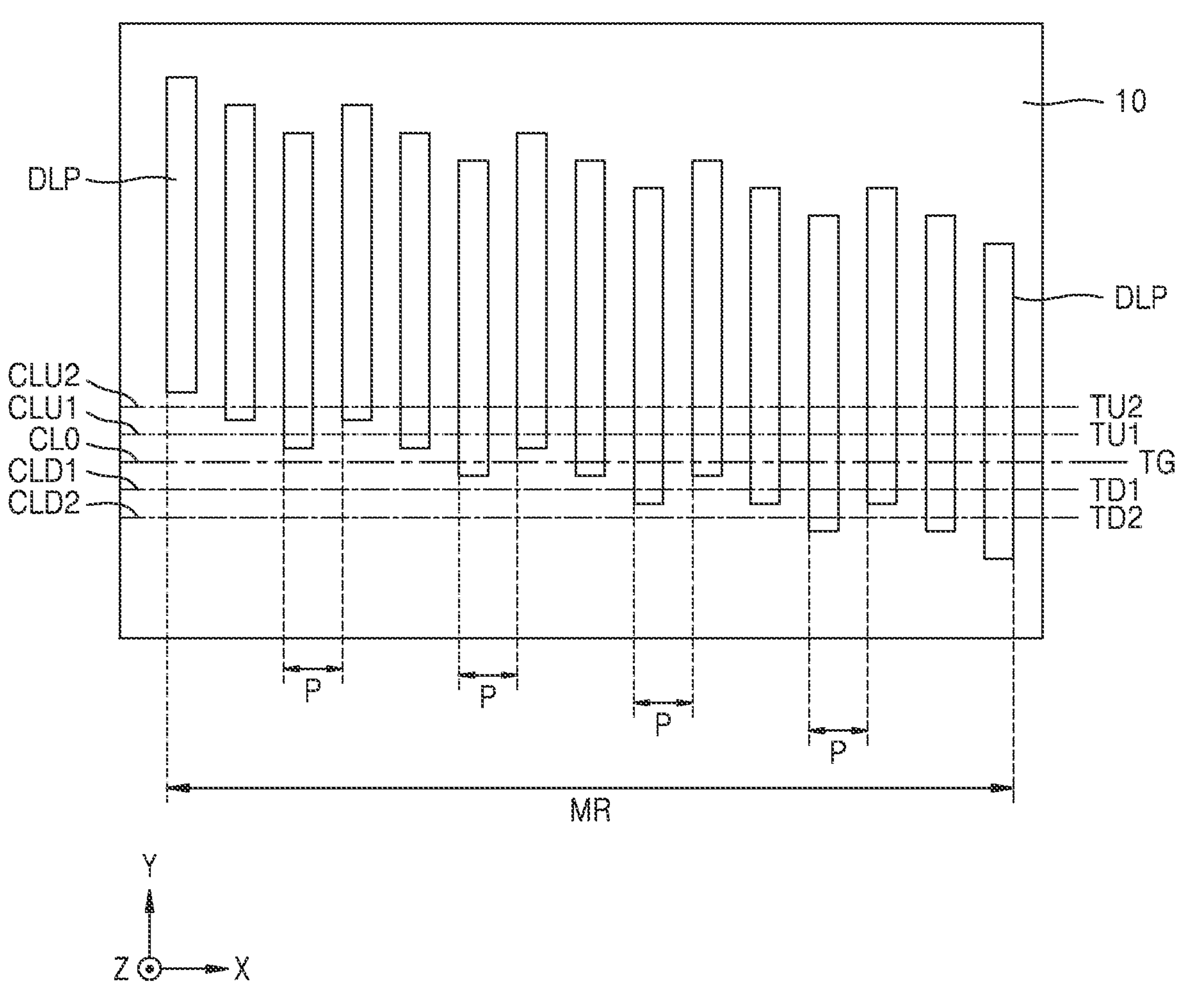
FIGS. 10, 11A, 12A, and 13A are plan views of a photomask that may be used in a process of manufacturing an integrated circuit device according to some embodiments.

In some embodiments, a cut line passing or extending through at least a portion of the plurality of monitoring line patterns MLP in a first horizontal direction (X direction) may be selected from a plurality of cut lines corresponding to the plurality of design cut lines CL0, CLU1, CLU2, CLD1, and CLD2 illustrated in FIG. 10, but is not limited thereto. For example, the cut line may be selected from straight lines passing or extending through a portion to be monitored in the etching mask pattern 130P or the feature pattern FP in the first horizontal direction (X direction).

The plurality of design cut lines CL0, CLU1, CLU2, CLD1, and CLD2 illustrated in FIG. 10 may include a design cut line CL0 extending in a first horizontal direction (X direction) from the monitoring target position TG, a design cut line CLU1 extending along a first horizontal direction (X direction) from the first target upper position TU1 moved upward by a first distance in FIG. 10 along the second horizontal direction (Y direction) from the monitoring target position TG, a design cut line CLU2 extending along a first horizontal direction (X direction) from the second target upper position TU2 moved upward by a second distance greater than the first distance in FIG. 10 along the second horizontal direction (Y direction) from the monitoring target position TG, a design cut line CLD1 extending along a first horizontal direction (X direction) from the first target lower position TD1 moved downward by the first distance in FIG. 10 along the second horizontal direction (Y direction) from the monitoring target position TG, and a design cut line CLD2 extending along a first horizontal direction (X direction) from the second target lower position TD2 moved downward by the second distance in FIG. 10 along the second horizontal direction (Y direction) from the monitoring target position TG.

The process of determining the line end profile error in a plurality of monitoring line patterns MLP according to process P80E of FIG. 8 may include a process of determining an error on a sidewall of an end portion of at least one monitoring line pattern MLP selected from among a plurality of monitoring line patterns MLP based on the cross-sectional structure of the plurality of monitoring line patterns MLP taken along the cut line passing or extending through the feature pattern FP in the first horizontal direction (X direction) at a position corresponding to one design cut line selected from a plurality of design cut lines CL0, CLU1, CLU2, CLD1, and CLD2 illustrated in FIG. 10. The error may include a bulging error or a pinch error.

Figure 14A:
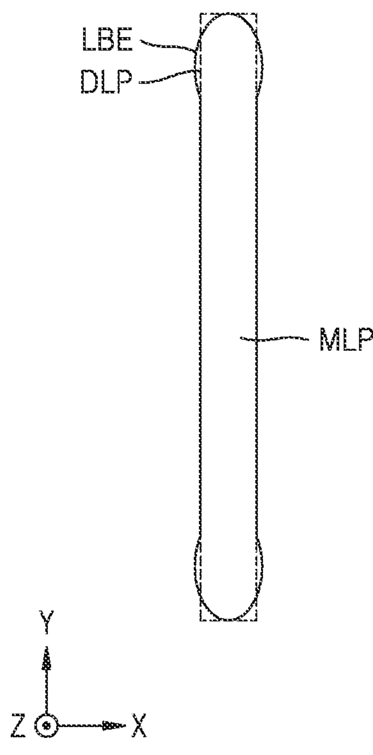
FIG. 14A is a plan view illustrating a case where there is a bulging error on a sidewall of an end portion of a monitoring line pattern obtained from a design line pattern in a process of manufacturing an integrated circuit device according to some embodiments.
Figure 14B:
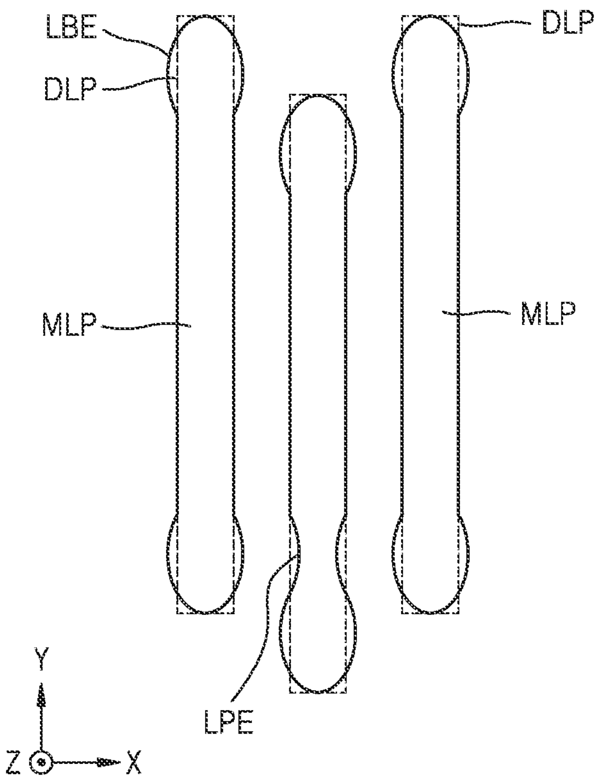
FIG. 14B is a plan view illustrating a case where there is a bulging error and a case where there is a pinch error on the sidewall of the end portion of the monitoring line pattern obtained from the designed line pattern in the process of manufacturing an integrated circuit device according to some embodiments.

FIG. 14A is a plan view illustrating a case where a bulging error LBE exists on a sidewall of an end portion of a monitoring line pattern MLP obtained from a design line pattern DLP. FIG. 14B is a plan view illustrating a case where there is a bulging error LBE and a case where there is a pinch error LPE on the sidewall of the end portion of the monitoring line pattern MLP obtained from the design line pattern DLP.

In the process of determining line end profile errors in a plurality of monitoring line patterns MLP according to process P80E of FIG. 8, errors of various shapes including the bulging error LBE and the pinch error LPE illustrated in FIGS. 14A and 14B may be determined.

In some embodiments, in the process of determining line end profile errors in a plurality of monitoring line patterns MLP according to process P80E of FIG. 8, as illustrated in FIGS. 10, 11A, 12A, and 13A, one design cut line selected from the plurality of design cut lines CL0, CLU1, CLU2, CLD1, and CLD2 may pass or extend through the first to fourth monitoring design line patterns M1, M2, M3, and M4 selected from among the plurality of design line patterns DLP in the first horizontal direction (X direction).

Figure 11A:
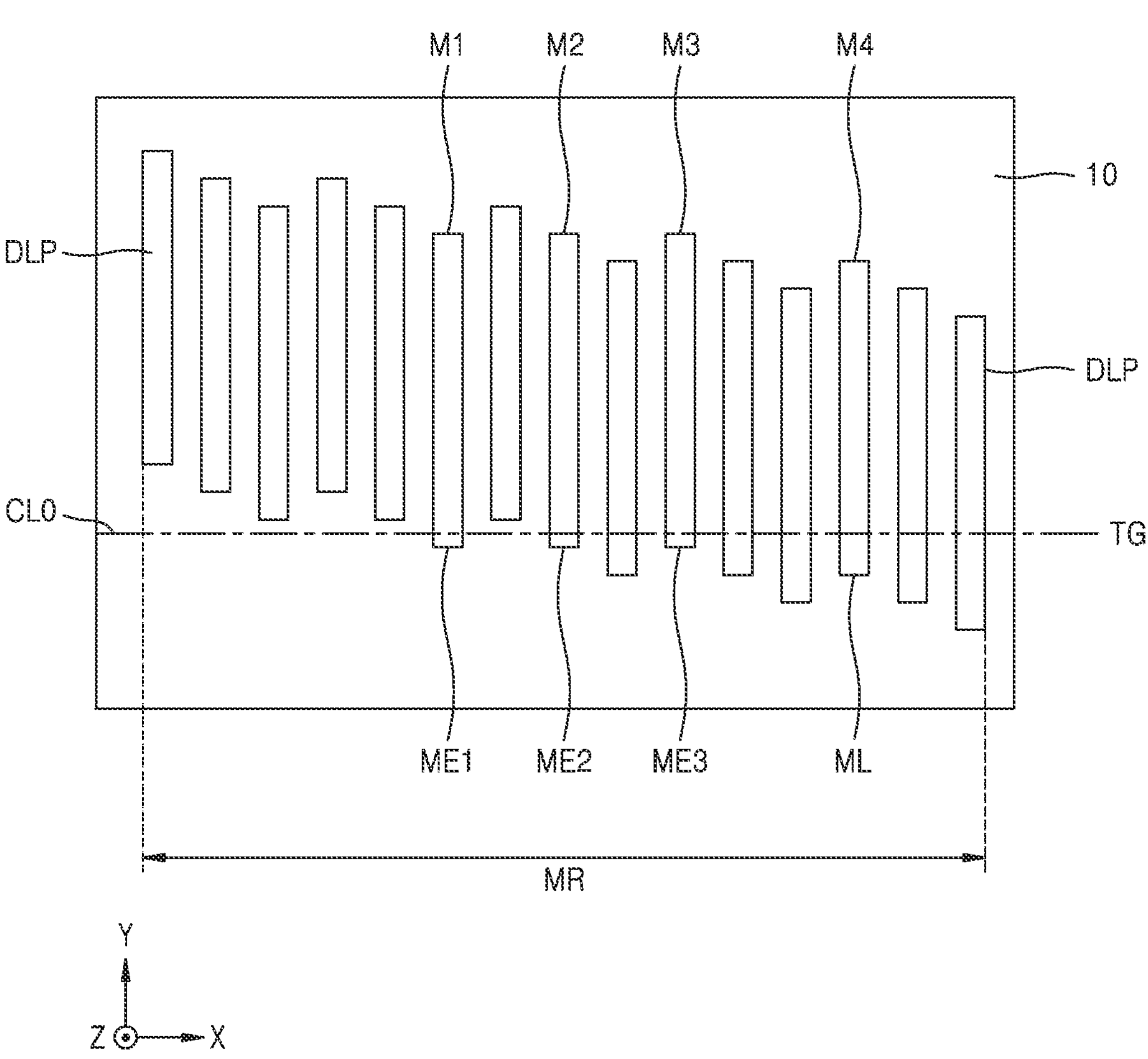
Figure 11B:
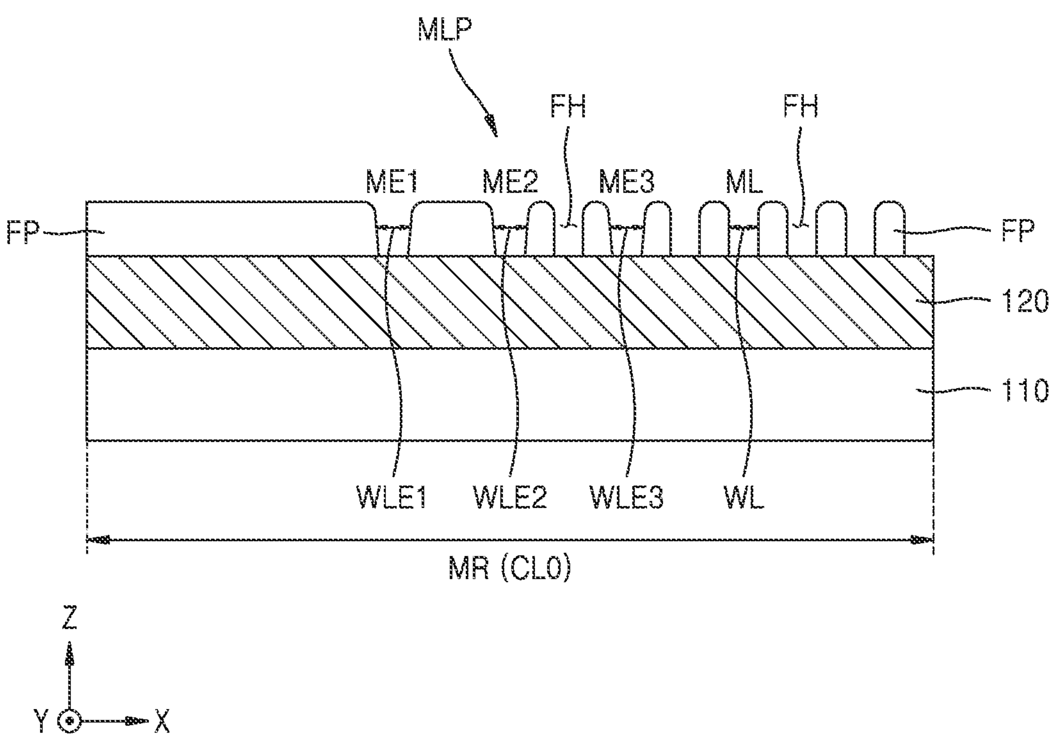
FIGS. 11B, 12B, and 13B are cross-sectional views of components formed in a monitoring area of a substrate in a process of manufacturing an integrated circuit device according to some embodiments.

In one example, as illustrated in FIG. 11A, the design cut line CL0 corresponding to the monitoring target position TG may pass or extend through the first to fourth monitoring design line patterns M1, M2, M3, and M4 selected from among the plurality of design line patterns DLP in the first horizontal direction (X direction).

Figure 12A:
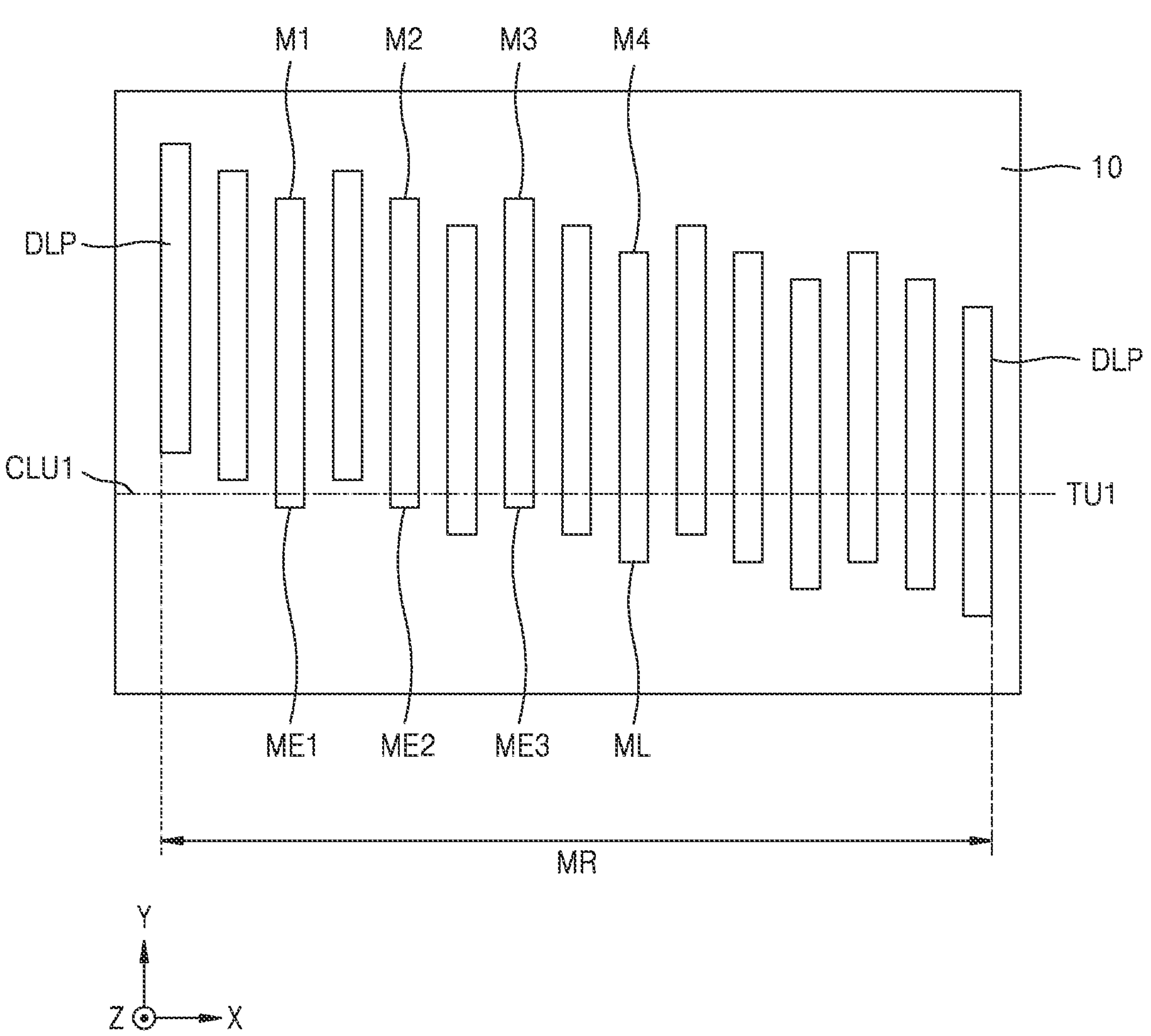
Figure 12B:
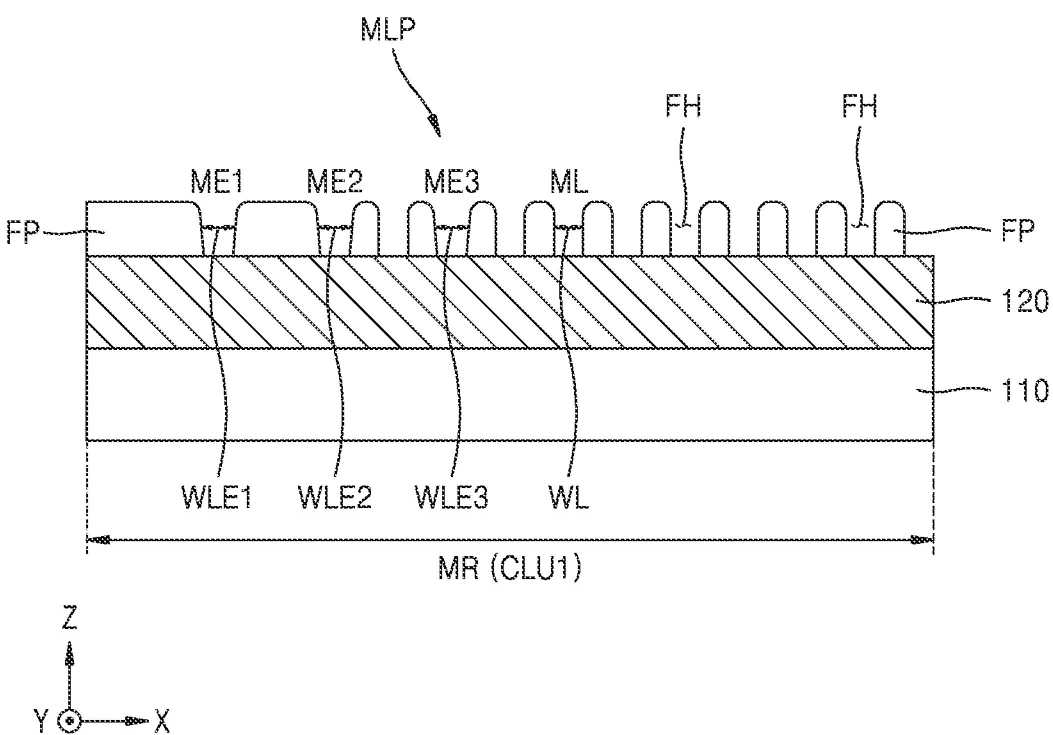

In one example, as illustrated in FIG. 12A, the design cut line CLU1 corresponding to the monitoring target position TU1 may pass or extend through the first to fourth monitoring design line patterns M1, M2, M3, and M4 selected from among the plurality of design line patterns DLP in the first horizontal direction (X direction).

Figure 13A:
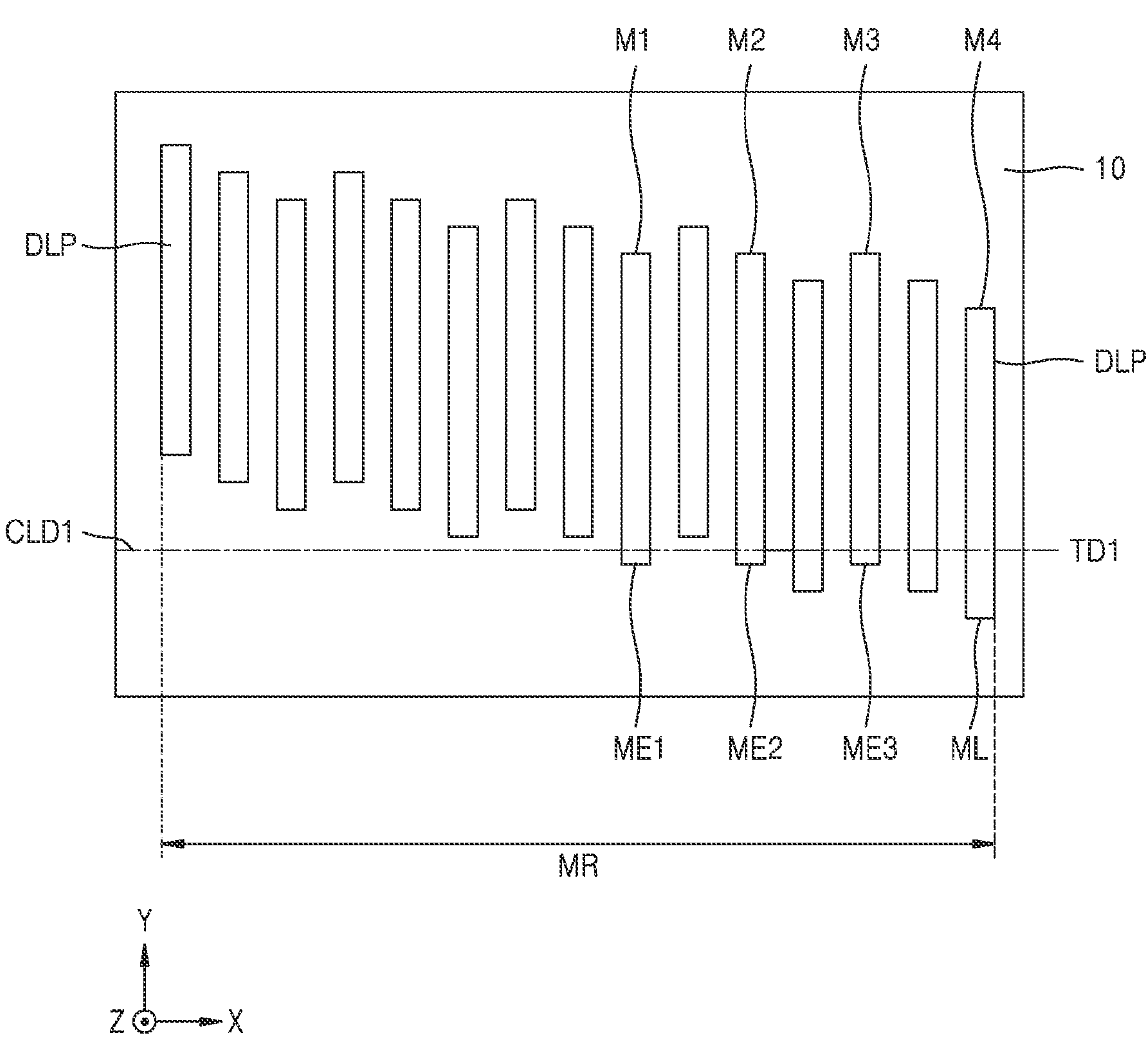
Figure 13B:
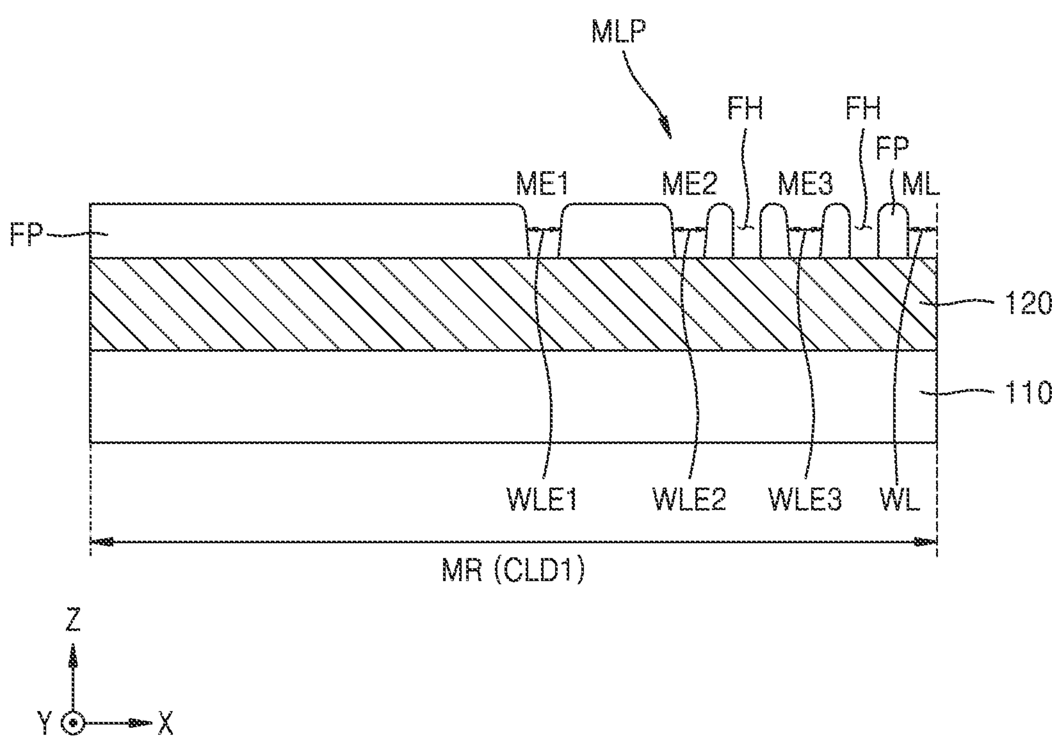

In another example, as illustrated in FIG. 13A, the design cut line CLD1 corresponding to the first target lower position TD1 may pass or extend through the first to fourth monitoring design line patterns M1, M2, M3, and M4 selected from among the plurality of design line patterns DLP in the first horizontal direction (X direction).

As illustrated in FIGS. 11A, 12A, and 13A, the design cut lines CL0, CLU1, and CLD1 may pass or extend through the first to third design line end portions ME1, ME2, and ME3 of the respective first to third monitoring design line patterns M1, M2, and M3; and the design main line portion ML of the fourth monitoring design line pattern M4. The first to third monitoring design line patterns M1, M2, and M3 may have design line end portions ME1, ME2, and ME3 having different surrounding environments.

As illustrated in FIGS. 11A, 12A, and 13A, both sidewalls of the first design line end portion ME1 through which the design cut lines CL0, CLU1, and CLD1 of the first monitoring design line pattern M1 pass or extend may not face another design line pattern DLP selected from among the plurality of design line patterns DLP and adjacent to the first monitoring design line pattern M1. For example, opposing sidewalls of the first design line end portion ME1 of the first monitoring design line pattern M1 may not overlap, in the first horizontal direction (X direction), one or more design line patterns DLP from the plurality of design line patterns DLP that are adjacent to the first monitoring design line pattern M1. The design cut lines CL0, CLU1, and/or CLD1 may extend through the first design line end portion ME1. As used herein, “an element A may not overlap, in a direction X, an element B” may mean that there is not at least one line that extends in a direction X and intersects both the elements A and B.

The first sidewall of the second design line end portion ME2 through which the design cut lines CL0, CLU1, and CLD1 of the second monitoring design line pattern M2 pass or extend may not face the first neighboring design line pattern DLP selected from among the plurality of design line patterns DLP and adjacent to the second monitoring design line pattern M2, and the second sidewall on the opposite side of the first sidewall of the second design line end portion ME2 may face a second neighboring design line pattern DLP selected from among the plurality of design line patterns DLP and adjacent to the second monitoring design line pattern M2. For example, a first sidewall of the second design line end portion ME2 of the second monitoring design line pattern M2 may not overlap, in the first horizontal direction (X direction), a first design line pattern DLP from the plurality of design line patterns DLP that is adjacent to the first sidewall, and a second sidewall of the second design line end portion ME2 opposing the first sidewall may overlap, in the first horizontal direction (X direction), a second design line pattern DLP from the plurality of design line patterns DLP that is adjacent to the second sidewall. The design cut lines CL0, CLU1, and/or CLD1 may extend through the second design line end portion ME2.

Both sidewalls of the third design line end portion ME3 through which the design cut lines CL0, CLU1, and CLD1 of the third monitoring design line pattern M3 pass or extend may face another design line pattern DLP selected from among the plurality of design line patterns DLP and adjacent to the third monitoring design line pattern M3. For example, opposing sidewalls of the third design line end portion ME3 of the third monitoring design line pattern M3 may overlap, in the first horizontal direction (X direction), one or more design line patterns DLP from the plurality of design line patterns DLP that are adjacent to the third monitoring design line pattern M3. The design cut lines CL0, CLU1, and/or CLD1 may extend through the third design line end portion ME3.

Of the fourth monitoring design line pattern M4, the portion through which the design cut lines CL0, CLU1, and CLD1 pass or extend may be a design main line portion ML spaced apart from the fourth design line end portion included in both sides of the second horizontal direction (Y direction) of the fourth monitoring design line pattern M4. For example, a portion of the fourth monitoring design line pattern M4 that the design cut lines CL0, CLU1, and/or CLD1 extend through may be a design main line portion ML. The design main line portion ML may be spaced apart from a fourth design line end portion (not labeled) included on respective ends in the second horizontal direction (Y direction) of the fourth monitoring design line pattern M4. Both sidewalls in the first horizontal direction (X direction) of the design main line portion ML may face a design main line portion spaced apart from a design line end portion of another design line pattern DLP selected from among a plurality of design line patterns DLP and adjacent to the fourth monitoring design line pattern M4. For example, opposing sidewalls of the design main line portion ML may overlap, in the first horizontal direction (X direction), a design main line portion (not labeled) spaced apart from respective design line end portions (not labeled) of one or more design line patterns DLP from the plurality of design line patterns DLP that are adjacent to the fourth monitoring design line pattern M4.

As illustrated in FIGS. 11A, 12A, and 13A, one other design line pattern DLP selected from among a plurality of design line patterns DLP may be disposed between the first monitoring design line pattern M1 and the second monitoring design line pattern M2, between the second monitoring design line pattern M2 and the third monitoring design line pattern M3, and between the third monitoring design line pattern M3 and the fourth monitoring design line pattern M4. That is, the first monitoring design line pattern M1, the second monitoring design line pattern M2, the third monitoring design line pattern M3, and the fourth monitoring design line pattern M4 may be selected from among a plurality of design line patterns DLP spaced apart from each other with one other design line pattern DLP selected from among the plurality of design line patterns DLP therebetween. For example, a first design line pattern DLP from the plurality of design line patterns DLP may be between the first monitoring design line pattern M1 and the second monitoring design line pattern M2, a second design line pattern DLP from the plurality of design line patterns DLP may be between the second monitoring design line pattern M2 and the third monitoring design line pattern M3, and a third design line pattern DLP from the plurality of design line patterns DLP may be between the third monitoring design line pattern M3 and the fourth monitoring design line pattern M4.

In the process of determining line end profile errors in a plurality of monitoring line patterns MLP according to process P80E of FIG. 8, the bulging errors in the first monitoring design line pattern M1, the second monitoring design line pattern M2, and the third monitoring design line pattern M3 may be determined according to Equation 1 below.

$$B_{LE}=(W_{MEi}-W_{ML})/2 \quad \text{[Equation 1]:}$$

In Equation 1, $B_{LE}$ is the magnitude of the bulging error generated in the line end portion (also referred to as an "end portion") of the monitoring line pattern MLP in the first horizontal direction (X direction).

WME1 is one selected from first to third widths WLE1, WLE2, and WLE3 in the first horizontal direction (X direction) of the monitoring line pattern MLP obtained on the substrate 110 from the first to third design line end portions ME1, ME2, and ME3 of the first to third monitoring design line patterns M1, M2, and M3. For example, WME1 is selected from one of the first to third widths WLE1, WLE2, or WLE3 in the first horizontal direction (X direction).

$W_{ML}$ is the fourth width WL in the first horizontal direction (X direction) of the monitoring line pattern MLP obtained on the substrate 110 from the design main line portion ML of the fourth monitoring design line pattern M4.

More specifically, the first width WLE1 is the width in the first horizontal direction (X direction) of the portion selected from a plurality of monitoring line patterns MLP included in the feature pattern FP and corresponding to the portion through which the design cut lines CL0, CLU1, and CLD1 pass or extend in the first monitoring design line pattern M1. For example, the first width WLE1 may correspond to a width of the first design line end portion ME1 in the first horizontal direction (X direction). The second width WLE2 is the width in the first horizontal direction (X direction) of the portion selected from a plurality of monitoring line patterns MLP included in the feature pattern FP and corresponding to the portion through which the design cut lines CL0, CLU1, and CLD1 pass or extend in the second monitoring design line pattern M2. For example, the second width WLE2 may correspond to a width of the second design line end portion ME2 in the first horizontal direction (X direction). The third width WLE3 is the width in the first horizontal direction (X direction) of a portion selected from a plurality of monitoring line patterns MLP included in the feature pattern FP and corresponding to a portion through which the design cut lines CL0, CLU1, and CLD1 pass or extend in the third monitoring design line pattern M3. For example, the third width WLE3 may correspond to a width of the third design line end portion ME3 in the first horizontal direction (X direction). The fourth width WL is the width of the portion selected from a plurality of monitoring line patterns MLP included in the feature pattern FP and corresponding to the portion through which the design cut lines CL0, CLU1, and CLD1 pass or extend in the fourth monitoring design line pattern M4 in the first horizontal direction (X direction). For example, the fourth width WL may correspond to a width of the design main line portion ML of the fourth monitoring design line pattern M4 in the first horizontal direction (X direction).

According to Equation 1, if a value corresponding to ½ of the difference value obtained by subtracting the value of the fourth width WL from one value selected from among the first width WLE1, the second width WLE2, or the third width WLE3 is greater than 0, the first horizontal direction (X direction) magnitude $B_{LE}$ of the bulging error generated in the line end portion of one monitoring line pattern MLP selected from among the plurality of monitoring line patterns MLP may be determined that a bulging error protrudes in the first horizontal direction on a sidewall of a line end portion of the selected one monitoring line pattern MLP. For example, when ½ of a difference value is greater than 0, it may be determined that a sidewall of an end portion of at least one monitoring line pattern MLP from the plurality of monitoring line patterns MLP has a bulging error in the first horizontal direction (X direction). The difference value may be obtained by subtracting the fourth width WL from one of the first width WLE1, the second width WLE2, or the third width WLE3.

In some embodiments, in the process of determining the line end profile error in the plurality of monitoring line patterns MLP included in the feature pattern FP according to process P80E of FIG. 8, when a value ((WLE1−WL)/2) corresponding to ½ of the difference value (WLE1−WL) obtained by subtracting the width WL in the first horizontal direction (X direction) of the main line portion ML spaced apart from respective line end portions of another monitoring line pattern MLP selected from among the plurality of monitoring line patterns MLP from the first width WLE1 in the first horizontal direction (X direction) of the line end portion of one monitoring line pattern MLP selected from among the plurality of monitoring line patterns MLP is greater than 0, it may be determined that there is a bulging error protruding in the first horizontal direction (X direction) on the sidewall of the line end portion of the selected one monitoring line pattern MLP. Here, the selected one monitoring line pattern MLP corresponds to a first monitoring design line pattern M1 selected from among a plurality of design line patterns DLP disposed on the photomask 10, and both sidewalls of the line end portion of the first monitoring design line pattern M1 may not face another design line pattern DLP adjacent to the first monitoring design line pattern M1. For example, a main line portion ML of a monitoring line pattern MLP from the plurality of monitoring line patterns MLP may be spaced apart from respective end portions of the monitoring line pattern MLP.

In other embodiments, in the process of determining the line end profile error in the plurality of monitoring line patterns MLP included in the feature pattern FP according to process P80E of FIG. 8, when a value ((WLE2−WL)/2) corresponding to ½ of the difference value (WLE2−WL) obtained by subtracting the width WL in the first horizontal direction (X direction) of the main line portion ML spaced apart from the respective line end portions of another monitoring line pattern MLP selected from among the plurality of monitoring line patterns MLP from the second width WLE2 in the first horizontal direction (X direction) of the line end portion of one monitoring line pattern MLP selected from among the plurality of monitoring line patterns MLP is greater than 0, it may be determined that there is a bulging error protruding in the first horizontal direction (X direction) on the sidewall of the line end portion of the selected one monitoring line pattern MLP. Here, the selected one monitoring line pattern MLP corresponds to a second monitoring design line pattern M2 selected from among a plurality of design line patterns DLP disposed on the photomask 10, and the first sidewall of the line end portion of the second monitoring design line pattern M2 may not face another design line pattern DLP adjacent to the second monitoring design line pattern M2, and the second sidewall opposite to the first sidewall may face another design line pattern DLP adjacent to the second monitoring design line pattern M2.

In other embodiments, in the process of determining the line end profile error in the plurality of monitoring line patterns MLP included in the feature pattern FP according to process P80E of FIG. 8, when a value ((WLE3−WL)/2) corresponding to ½ of the difference value (WLE3−WL) obtained by subtracting the width WL in the first horizontal direction (X direction) of the main line portion ML spaced apart from the respective line end portions of another monitoring line pattern MLP selected from among the plurality of monitoring line patterns MLP from the third width WLE3 in the first horizontal direction (X direction) of the line end portion of one monitoring line pattern MLP selected from among the plurality of monitoring line patterns MLP is greater than 0, it may be determined that there is a bulging error protruding in the first horizontal direction (X direction) on the sidewall of the line end portion of the selected one monitoring line pattern MLP. Here, the selected one monitoring line pattern MLP corresponds to a third monitoring design line pattern M3 selected from among a plurality of design line patterns DLP disposed on the photomask 10, and both sidewalls of the line end portion of the third monitoring design line pattern M3 may face another design line pattern DLP adjacent to the third monitoring design line pattern M3.

Referring back to FIG. 8, when it is determined that there is a line end profile error in a plurality of monitoring line patterns MLP in process P80F, the photomask 10 may be corrected in process P80G, and the above-described processes of process P80A to process P80E may be repeated. If it is determined in process P80F that there is no line end profile error in multiple monitoring line patterns MLP, the integrated circuit device 100 may be completed by performing subsequent processes as necessary. For example, in process P80G, the photomask 10 may be corrected to account for the line end profile error such that a line pattern of a desired shape is subsequently formed. For example, process P80G may include operations for forming a pattern of a desired shape by correcting distortion phenomena resulting from photolithography performed during a process of manufacturing an integrated circuit device. For example, the photomask 10 may be corrected in process P80G according to a determination result, and the determination result may correspond to a line end profile error determined in at least one monitoring line pattern MLP from the plurality of monitoring line patterns MLP.

Figure 15:
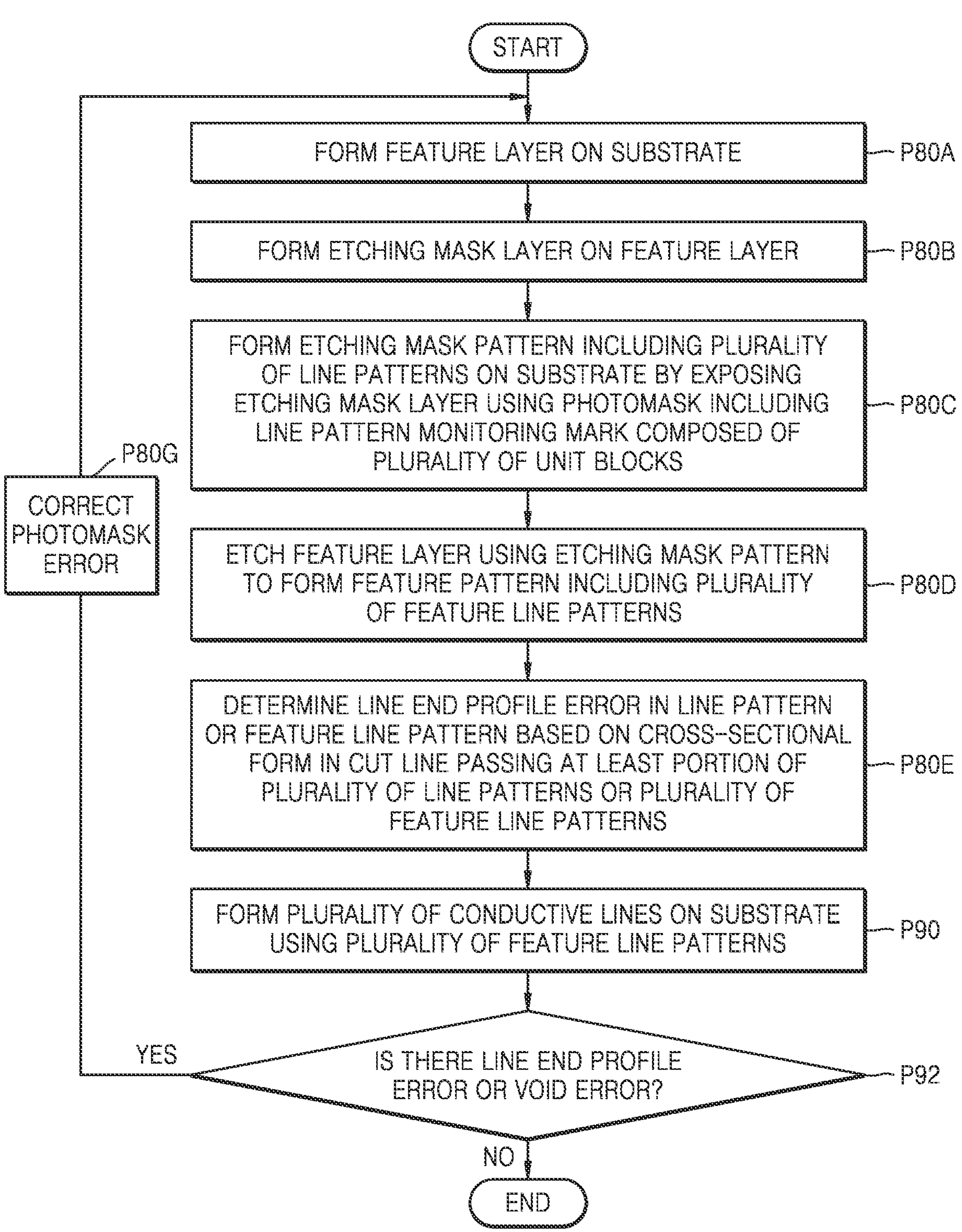
FIG. 15 is a flowchart for explaining another manufacturing method of an integrated circuit device according to some embodiments.
Figure 16:
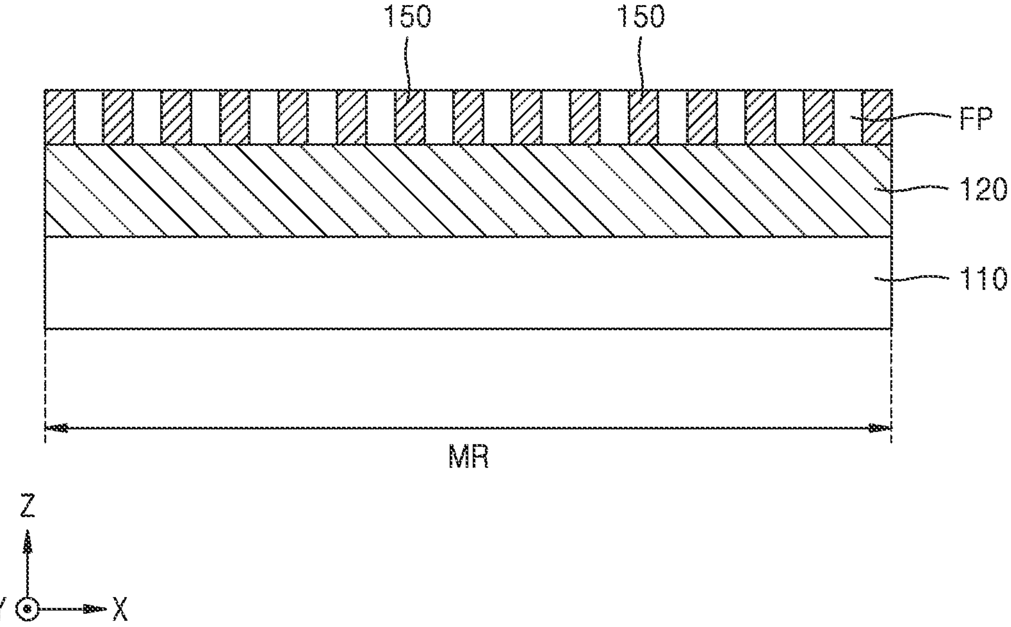
FIG. 16 is a cross-sectional view for explaining some processes in a method of manufacturing an integrated circuit device according to some embodiments.

FIG. 15 is a flowchart for explaining another manufacturing method of an integrated circuit device according to some embodiments. FIG. 16 is a cross-sectional view for explaining some processes in a method of manufacturing an integrated circuit device according to some embodiments.

Referring to FIG. 15, process P80A, process P80B, process P80C, process P80D, and process P80E may be performed in the same manner described with reference to FIGS. 8, 9A to 9D, 10, 11A, 11B, 12A, 12B, 13A, and 13B.

After that, in process P90 of FIG. 15, as illustrated in FIG. 16, a plurality of conductive lines 150 may be formed on the substrate 110 using a feature line pattern consisting of a plurality of openings FH included in the feature pattern FP illustrated in FIG. 9D.

In example embodiments, each of the plurality of conductive lines 150 may be made of metal, conductive metal nitride, or a combination thereof. For example, each of the plurality of conductive lines 150 may include copper (Cu), tungsten (W), ruthenium (Ru), titanium (Ti), tantalum (Ta), or a combination thereof, but is not limited thereto.

After that, void errors in the plurality of conductive lines 150 may be determined. The term "void error" used herein refers to when a region to be filled with a conductive material among the plurality of conductive lines 150 is undesirably emptied and at least a portion of the plurality of conductive lines 150 is in a void state.

Determining the void error in the plurality of conductive lines 150 may include analyzing a cross-section of at least some of the plurality of conductive lines 150, particularly, the line end portion of each of the at least some of the conductive lines 150, using a transmission electron microscope (TEM).

In process P92 of FIG. 15, when it is determined that there is a line end profile error in at least a portion (e.g., the plurality of monitoring line patterns MLP illustrated in FIGS. 11B, 12B, and 13B) of a plurality of feature line patterns including a plurality of openings FH formed in the feature pattern FP illustrated in FIG. 9D, or when it is determined that there is a void error in the plurality of conductive lines 150 formed according to process P90, process P80G may be performed.

The photomask 10 is corrected in process P80G, and the above-described processes of process P80A to process P80E may be repeated. When it is determined in process P90 that there are no line end profile errors in the plurality of monitoring line patterns MLP and no void errors in the plurality of conductive lines 150, the integrated circuit device 100 may be completed by performing subsequent processes as necessary.

According to the manufacturing method of an integrated circuit device of the present disclosure, by precisely monitoring various line end profile errors including a bulging error in which the width partially increases at the end portion of the line pattern in the longitudinal direction, a pinch error in which the width partially decreases in the end portion of the line, or a void error, pattern profile errors may be determined. In addition, by simultaneously monitoring various types of line end profile errors of various patterns in various surrounding environments using one monitoring sample, it is possible to improve the precision of the pattern shape to be formed on the substrate, so that the manufacturing cost of the integrated circuit device may be lowered and the reliability may be improved.

As used herein, the terms "comprises", "comprising", "includes", "including", "has", "having" and any other variations thereof specify the presence of the stated features, integers, steps, operations, elements, and/or components, but do not preclude the presence or addition of one or more other features, integers, steps, operations, elements, components, and/or groups thereof.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

While the inventive concept has been particularly shown and described with reference to example embodiments thereof, it will be understood that various changes in form and details may be made therein without departing from the scope of the following claims.

What is claimed is:

1. A photomask comprising:

a pattern area for configuring a pattern in a chip area of a substrate; and at least one line pattern monitoring mark spaced apart from the pattern area, wherein the at least one line pattern monitoring mark comprises a plurality of unit blocks that comprise a plurality of design line patterns, and the plurality of design line patterns are arranged at a constant pitch along a first horizontal direction, wherein each of the plurality of unit blocks comprises three design line patterns from the plurality of design line patterns, and adjacent ones of the plurality of unit blocks are offset from each other in a second horizontal direction perpendicular to the first horizontal direction, and wherein the plurality of unit blocks comprise a first unit block and a second unit block adjacent to the first unit block in the first horizontal direction, the second unit block is offset from the first unit block by a rounding length in the second horizontal direction, and the second unit block is spaced apart from the first unit block in the first horizontal direction.

2. The photomask of claim 1, wherein the three design line patterns comprise a first design line pattern, a second design line pattern, and a third design line pattern sequentially arranged along the first horizontal direction, wherein the second design line pattern is offset from the first design line pattern by the rounding length in the second horizontal direction, and is spaced apart from the first design line pattern in the first horizontal direction, and wherein the third design line pattern is offset from the second design line pattern by the rounding length in the second horizontal direction, and is spaced apart from the second design line pattern in the first horizontal direction.

3. The photomask of claim 1, wherein each of the three design line patterns has a same shape in a plan view.

4. The photomask of claim 1, wherein the rounding length is equal to a length in the second horizontal direction of a round line end included in a virtual line pattern obtained from a simulation result using an optical proximity correction (OPC) model of one design line pattern from the plurality of design line patterns.

5. The photomask of claim 1, wherein the rounding length is equal to a length in the second horizontal direction of a round line end included in a plurality of line patterns implemented in a chip area of another substrate.

6. A method of manufacturing an integrated circuit device using the photomask of claim 1, the method comprising:

forming a feature layer on the substrate;

forming an etching mask on the feature layer;

forming, on the substrate, an etching mask pattern including a plurality of line patterns by exposing the etching mask using the photomask of claim 1;

etching the feature layer using the etching mask pattern to form a feature pattern including a plurality of feature line patterns; and determining a line end profile error in a plurality of monitoring line patterns based on a cross-sectional structure of the plurality of monitoring line patterns taken along a cut line extending through at least a portion of the plurality of monitoring line patterns in the first horizontal direction, the plurality of monitoring line patterns comprising one of the plurality of line patterns or the plurality of feature line patterns.

7. The method of claim 6, wherein the determining of the line end profile error comprises determining one of a bulging error or a pinch error on a sidewall of an end portion of at least one monitoring line pattern from the plurality of monitoring line patterns based on the cross-sectional structure of the plurality of monitoring line patterns taken along the cut line.

8. The method of claim 6, wherein, in the determining of the line end profile error, a position of the cut line corresponds to a position of a design cut line extending in the first horizontal direction through at least two design line patterns from the plurality of design line patterns of the photomask.

9. The method of claim 8, wherein, in the determining of the line end profile error, the design cut line extends in the first horizontal direction through a first monitoring design line pattern, a second monitoring design line pattern, a third monitoring design line pattern, and a fourth monitoring design line pattern from the plurality of design line patterns, wherein opposing sidewalls of a first design line end portion of the first monitoring design line pattern do not overlap, in the first horizontal direction, one or more design line patterns from the plurality of design line patterns that are adjacent to the first monitoring design line pattern, the design cut line extending through the first design line end portion, wherein a first sidewall of a second design line end portion of the second monitoring design line pattern does not overlap, in the first horizontal direction, a first design line pattern from the plurality of design line patterns that is adjacent to the first sidewall, and a second sidewall of the second design line end portion opposing the first sidewall overlaps, in the first horizontal direction, a second design line pattern from the plurality of design line patterns that is adjacent to the second sidewall, the design cut line extending through the second design line end portion, wherein opposing sidewalls of a third design line end portion of the third monitoring design line pattern overlap, in the first horizontal direction, one or more design line patterns from the plurality of design line patterns that are adjacent to the third monitoring design line pattern, the design cut line extending through the third design line end portion, wherein a portion of the fourth monitoring design line pattern that the design cut line extends through comprises a design main line portion, the design main line portion being spaced apart in the second horizontal direction from fourth design line end portions included in respective ends of the fourth monitoring design line pattern, wherein opposing sidewalls of the design main line portion of the fourth monitoring design line pattern overlap, in the first horizontal direction, a design main line portion of one or more design line patterns from the plurality of design line patterns that are adjacent to the fourth monitoring design line pattern, and wherein the design main line portion of the one or more design line patterns adjacent to the fourth monitoring design line pattern is spaced apart in the second horizontal direction from respective design line end portions of the one or more design line patterns adjacent to the fourth monitoring design line pattern.

10. The method of claim 9, wherein the first design line pattern is between the first monitoring design line pattern and the second monitoring design line pattern, the second design line pattern is between the second monitoring design line pattern and the third monitoring design line pattern, and a third design line pattern from the plurality of design line patterns is between the third monitoring design line pattern and the fourth monitoring design line pattern.

11. The method of claim 9, wherein the determining of the line end profile error comprises determining, when ½ of a difference value is greater than 0, that a sidewall of an end portion of at least one monitoring line pattern from the plurality of monitoring line patterns has a bulging error in the first horizontal direction, wherein the difference value is obtained by subtracting a fourth width from one of a first width, a second width, or a third width, wherein the first width corresponds to a width of the first design line end portion in the first horizontal direction, wherein the second width corresponds to a width of the second design line end portion in the first horizontal direction, wherein the third width corresponds to a width of the third design line end portion in the first horizontal direction, and wherein the fourth width corresponds to a width of the design main line portion of the fourth monitoring design line pattern in the first horizontal direction.

12. The method of claim 6, wherein the determining of the line end profile error comprises determining, when ½ of a difference value is greater than 0, that a sidewall of an end portion of at least one monitoring line pattern from the plurality of monitoring line patterns has a bulging error in the first horizontal direction, wherein the difference value is obtained by subtracting a fourth width from a first width, wherein the fourth width is a width in the first horizontal direction of a main line portion of a fourth monitoring line pattern from the plurality of monitoring line patterns, the main line portion being spaced apart in the second horizontal direction from respective end portions of the fourth monitoring line pattern, wherein the first width is a width in the first horizontal direction of an end portion of a first monitoring line pattern from the plurality of monitoring line patterns, and wherein the first monitoring line pattern corresponds to a first monitoring design line pattern from the plurality of design line patterns of the photomask, and opposing sidewalls of a first design line end portion of the first monitoring design line pattern do not overlap, in the first horizontal direction, one or more design line patterns from the plurality of design line patterns that are adjacent to the first monitoring design line pattern.

13. The method of claim 6, wherein the determining of the line end profile error comprises determining, when ½ of a difference value is greater than 0, that a sidewall of an end portion of at least one monitoring line pattern from the plurality of monitoring line patterns has a bulging error in the first horizontal direction, wherein the difference value is obtained by subtracting a fourth width from a second width, wherein the fourth width is a width in the first horizontal direction of a main line portion of a fourth monitoring line pattern from the plurality of monitoring line patterns, the main line portion being spaced apart in the second horizontal direction from respective end portions of the fourth monitoring line pattern, wherein the second width is a width in the first horizontal direction of an end portion of a second monitoring line pattern from the plurality of monitoring line patterns, and wherein the second monitoring line pattern corresponds to a second monitoring design line pattern from the plurality of design line patterns of the photomask, and a first sidewall of a second design line end portion of the second monitoring design line pattern does not overlap, in the first horizontal direction, a first design line pattern from the plurality of design line patterns that is adjacent to the first sidewall, and a second sidewall of the second design line end portion opposing the first sidewall overlaps, in the first horizontal direction, a second design line pattern from the plurality of design line patterns that is adjacent to the second sidewall.

14. The method of claim 6, wherein the determining of the line end profile error comprises determining, when ½ of a difference value is greater than 0, that a sidewall of an end portion of at least one monitoring line pattern from the plurality of monitoring line patterns has a bulging error in the first horizontal direction, wherein the difference value is obtained by subtracting a fourth width from a third width, wherein the fourth width is a width in the first horizontal direction of a main line portion of a fourth monitoring line pattern from the plurality of monitoring line patterns, the main line portion being spaced apart in the second horizontal direction from respective end portions of the fourth monitoring line pattern, wherein the third width is a width in the first horizontal direction of an end portion of a third monitoring line pattern from the plurality of monitoring line patterns, and wherein the third monitoring line pattern corresponds to a third monitoring design line pattern from the plurality of design line patterns of the photomask, and opposing sidewalls of a third design line end portion of the third monitoring design line pattern overlap, in the first horizontal direction, one or more design line patterns from the plurality of design line patterns that are adjacent to the third monitoring design line pattern.

15. The method of claim 6, further comprising:

forming a plurality of conductive lines on the substrate using the plurality of feature line patterns after the determining of the line end profile error; and determining a void error in the plurality of conductive lines, wherein the determining of the void error comprises analyzing a cross-section of at least two of the plurality of conductive lines using a transmission electron microscope (TEM).

16. The method of claim 6, further comprising correcting the photomask according to a determination result after the determining of the line end profile error.

17. A method of manufacturing an integrated circuit device, the method comprising:

forming a plurality of monitoring line patterns on a substrate by performing an exposure process using a photomask that includes at least one line pattern monitoring mark having a plurality of unit blocks that comprise a plurality of design line patterns, the plurality of design line patterns being arranged at a constant pitch along a first horizontal direction;

determining a position of a design cut line extending through at least two design line patterns from the plurality of design line patterns in the first horizontal direction; and determining a line end profile error in a plurality of monitoring line patterns based on a cross-sectional structure of the plurality of monitoring line patterns taken along a cut line extending through at least a portion of the plurality of monitoring line patterns in the first horizontal direction, wherein a position of the cut line corresponds to the position of the design cut line, wherein each of the plurality of unit blocks comprises three design line patterns from the plurality of design line patterns, and adjacent ones of the plurality of unit blocks are offset from each other in a second horizontal direction perpendicular to the first horizontal direction, and wherein the plurality of unit blocks comprise a first unit block and a second unit block adjacent to the first unit block in the first horizontal direction, the second unit block being offset from the first unit block by a rounding length in the second horizontal direction, and the second unit block being spaced apart from the first unit block in the first horizontal direction.

18. The method of claim 17, wherein, in the determining of the line end profile error, the design cut line extends in the first horizontal direction through a first monitoring design line pattern, a second monitoring design line pattern, a third monitoring design line pattern, and a fourth monitoring design line pattern from the plurality of design line patterns, wherein opposing sidewalls of a first design line end portion of the first monitoring design line pattern do not overlap, in the first horizontal direction, one or more design line patterns from the plurality of design line patterns that are adjacent to the first monitoring design line pattern, the design cut line extending through the first design line end portion, wherein a first sidewall of a second design line end portion of the second monitoring design line pattern does not overlap, in the first horizontal direction, a first design line pattern from the plurality of design line patterns that is adjacent to the first sidewall, and a second sidewall of the second design line end portion opposing the first sidewall overlaps, in the first horizontal direction, a second design line pattern from the plurality of design line patterns that is adjacent to the second sidewall, the design cut line extending through the second design line end portion, wherein opposing sidewalls of a third design line end portion of the third monitoring design line pattern overlap, in the first horizontal direction, one or more design line patterns from the plurality of design line patterns that are adjacent to the third monitoring design line pattern, the design cut line extending through the third design line end portion, wherein a portion of the fourth monitoring design line pattern that the design cut line extends through comprises a design main line portion, the design main line portion being spaced apart in the second horizontal direction from fourth design line end portions included in respective ends of the fourth monitoring design line pattern, wherein opposing sidewalls of the design main line portion of the fourth monitoring design line pattern overlap, in the first horizontal direction, a design main line portion of one or more design line patterns from the plurality of design line patterns that are adjacent to the fourth monitoring design line pattern, and wherein the design main line portion of the one or more design line patterns adjacent to the fourth monitoring design line pattern is spaced apart in the second horizontal direction from respective design line end portions of the one or more design line patterns adjacent to the fourth monitoring design line pattern.

19. The method of claim 17, wherein the determining of the line end profile error comprises determining, when ½ of a difference value is greater than 0, that a sidewall of an end portion of at least one monitoring line pattern from the plurality of monitoring line patterns has a bulging error in the first horizontal direction, wherein the difference value is obtained by subtracting a fourth width from one of a first width, a second width, or a third width, wherein the first width is a width in the first horizontal direction of a first end portion of a first monitoring line pattern from the plurality of monitoring line patterns, the first end portion corresponding to a first design line end portion of a first monitoring design line pattern from the plurality of design line patterns, wherein the second width is a width in the first horizontal direction of a second end portion of a second monitoring line pattern from the plurality of monitoring line patterns, the second end portion corresponding to a second design line end portion of a second monitoring design line pattern from the plurality of design line patterns, wherein the third width is a width in the first horizontal direction of a third end portion of a third monitoring line pattern from the plurality of monitoring line patterns, the third end portion corresponding to a third design line end portion of a third monitoring design line pattern from the plurality of design line patterns, wherein the design cut line extends through the first design line end portion, the second design line end portion, and the third design line end portion, wherein the fourth width is a width in the first horizontal direction of a main line portion of a fourth monitoring line pattern from the plurality of monitoring line patterns, the main line portion corresponding to a design main line portion of a fourth monitoring design line pattern from the plurality of design line patterns, the design cut line extending through the design main line portion, and wherein the design main line portion is spaced apart in the second horizontal direction from respective fourth design line end portions of the fourth monitoring design line pattern.

20. The method of claim 17, further comprising:

forming a plurality of conductive lines on the substrate using a plurality of feature line patterns after the determining of the line end profile error; and determining a void error in the plurality of conductive lines, wherein the determining of the void error comprises analyzing a cross-section of at least two of the plurality of conductive lines using a transmission electron microscope (TEM).

* * * * *